(12) United States Patent
Liu et al.

(10) Patent No.: US 11,508,634 B2
(45) Date of Patent: Nov. 22, 2022

(54) SEMICONDUCTOR PACKAGE STRUCTURE, ELECTRONIC DEVICE, AND METHOD FOR MANUFACTURING THE SAME

(71) Applicant: Advanced Semiconductor Engineering, Inc., Kaohsiung (TW)

(72) Inventors: Syu-Tang Liu, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 3 days.

(21) Appl. No.: 17/063,571

(22) Filed: Oct. 5, 2020

(65) Prior Publication Data

US 2022/0108932 A1 Apr. 7, 2022

(51) Int. Cl.
*H01L 23/31* (2006.01)
*H01L 23/552* (2006.01)

(52) U.S. Cl.
CPC ...... *H01L 23/3121* (2013.01); *H01L 23/3135* (2013.01); *H01L 23/552* (2013.01)

(58) Field of Classification Search
None
See application file for complete search history.

(56) References Cited

U.S. PATENT DOCUMENTS

2021/0057380 A1\* 2/2021 Kim .................... H01L 23/4334

\* cited by examiner

*Primary Examiner* — Long Pham
(74) *Attorney, Agent, or Firm* — Foley & Lardner LLP

(57) ABSTRACT

A semiconductor package structure, an electronic device, and method for manufacturing the same are provided. The semiconductor package structure includes a wiring structure, a first electronic device, a second electronic device, and a protection material. The first electronic device is disposed on the wiring structure. The second electronic device is disposed on the wiring structure. The second electronic device defines a plurality of recesses on a first lateral side surface thereof. The protection material is disposed on the wiring structure and encapsulates the recesses of the second electronic device.

18 Claims, 36 Drawing Sheets

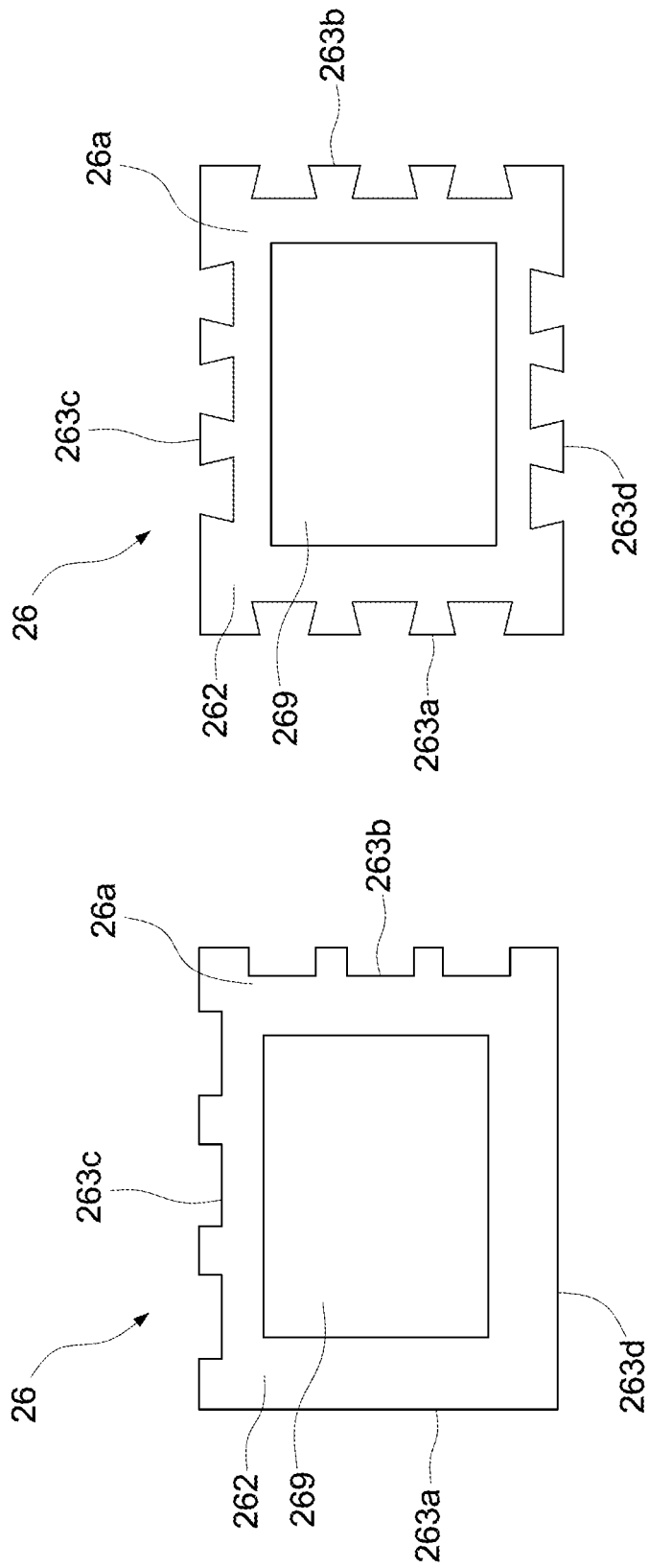

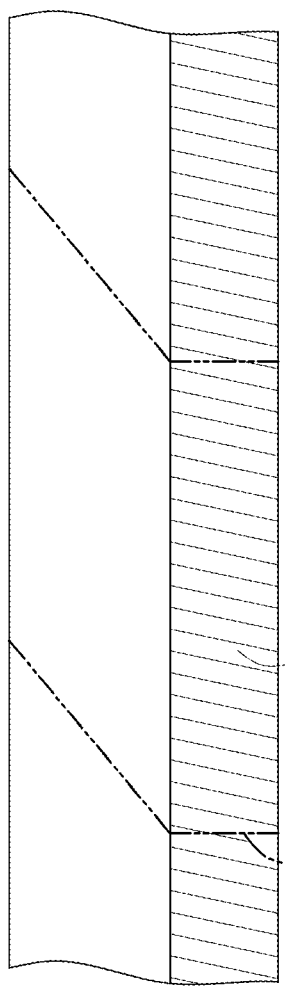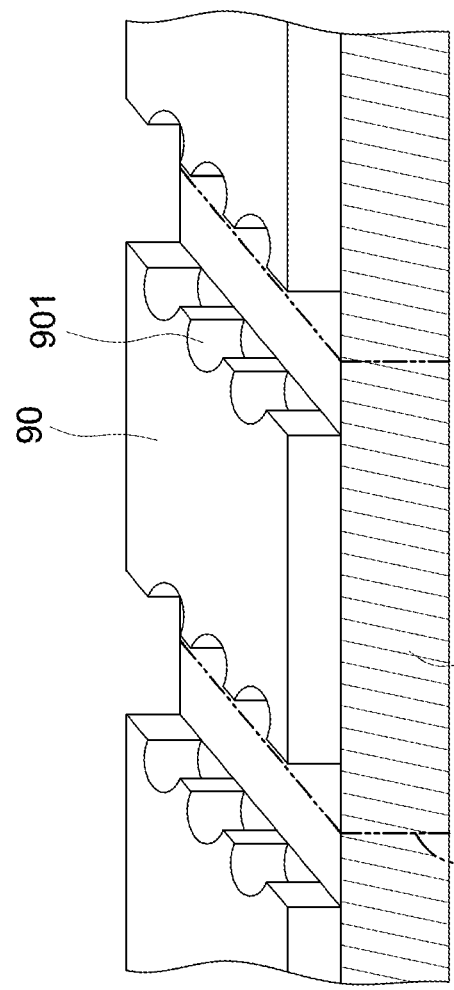

SEMICONDUCTOR PACKAGE STRUCTURE, ELECTRONIC DEVICE, AND METHOD FOR MANUFACTURING THE SAME

BACKGROUND

1. Field of the Disclosure

The present disclosure relates to a semiconductor package structure, an electronic device, and a manufacturing method, and to a semiconductor package structure including a plurality of recesses, an electronic device including a plurality of grooves, and a method for manufacturing the same.

2. Description of the Related Art

Along with the rapid development in electronics industry and the progress of semiconductor processing technologies, semiconductor package structures are integrated with an increasing number of electronic components or electronic devices to achieve improved electrical performance and additional functions. Accordingly, a warpage of the semiconductor package structure may occur during the thermal process. Since a rigidity or stiffness of the semiconductor package structure is relatively low, a delamination may be formed in the interface between different materials and a crack may be formed in the protection material, and then extend or grow into the interior of the semiconductor package structure. If the crack reaches the semiconductor package structure, the circuit layer in the semiconductor package structure may be damaged or broken, which may result in an open circuit and render the semiconductor package structure inoperative. Thus, a yield of the semiconductor package structure may decrease.

SUMMARY

In some embodiments, a semiconductor package structure includes a wiring structure, a first electronic device, a second electronic device, and a protection material. The first electronic device is disposed on the wiring structure. The second electronic device is disposed on the wiring structure. The second electronic device defines a plurality of recesses on a first lateral side surface thereof. The protection material is disposed on the wiring structure and encapsulates the recesses of the second electronic device.

In some embodiments, an electronic device includes a first die, a second die, and an encapsulant. The first die defines a plurality of first recesses on a lateral side surface thereof. The second die is stacked on a top surface of the first die and electrically connected to the first die. A size of the second die is less than a size of the first die. The encapsulant covers the second die and a portion of the top surface of the first die. The encapsulant defines a plurality of second recesses on a lateral side surface thereof.

In some embodiments, a manufacturing method includes: (a) providing a wafer having a plurality of scribe lines; (b) forming a patterned photoresist layer on the wafer to expose the plurality of scribe lines; and (c) cutting the wafer along the plurality of scribe lines to form a plurality of electronic devices. Each of the electronic devices defines a plurality of recesses on a lateral side surface thereof.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 6C illustrates a top view of the second electronic device according to some embodiments of the present disclosure.

FIG. 6D illustrates a top view of the second electronic device according to some embodiments of the present disclosure.

FIG. 33 illustrates one or more stages of an example of a method for manufacturing an electronic device according to some embodiments of the present disclosure.

FIG. 34 illustrates one or more stages of an example of a method for manufacturing an electronic device according to some embodiments of the present disclosure.

DETAILED DESCRIPTION

Figure 1:
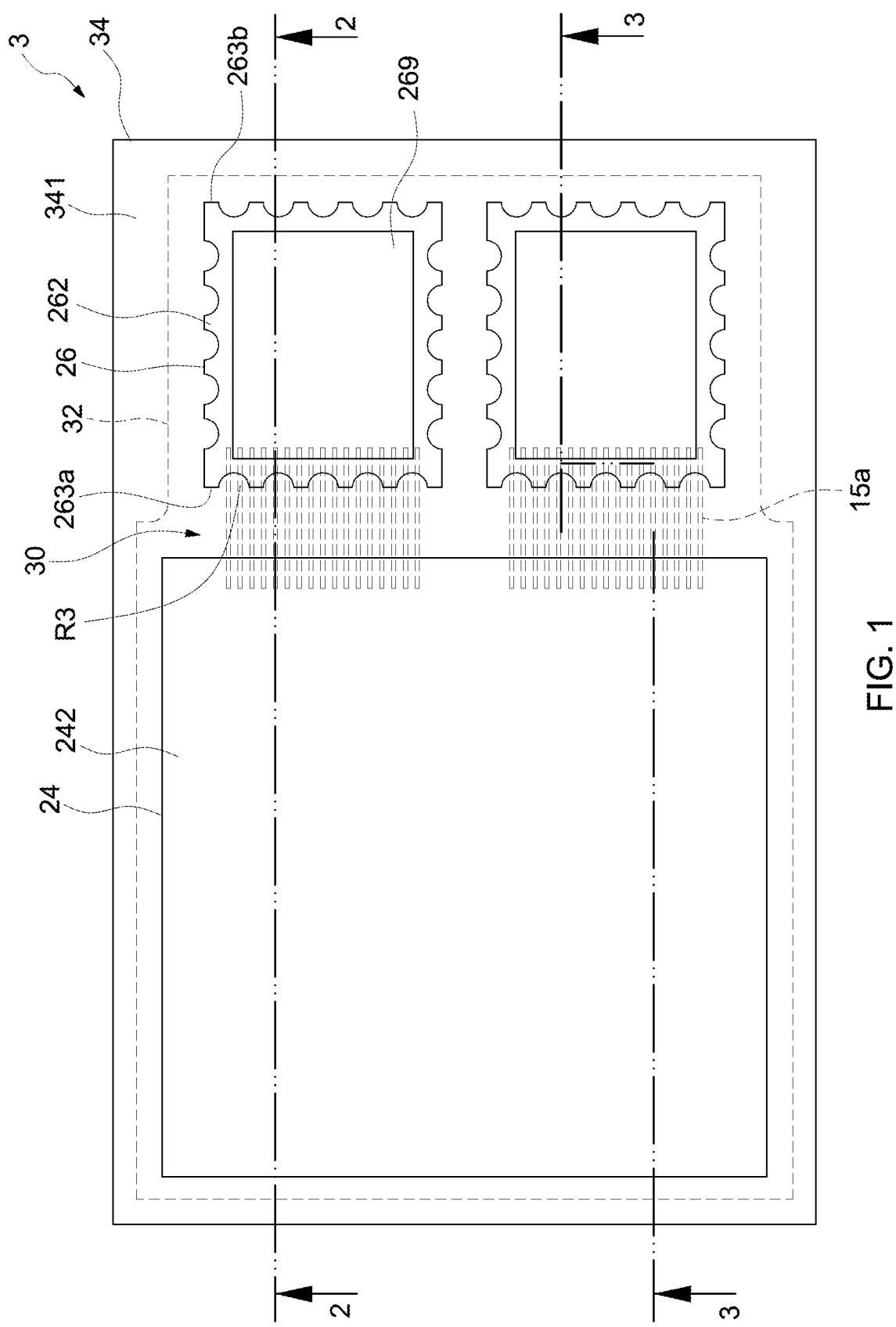
FIG. 1 illustrates a top view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved crack resistance so as to improve a reliability or a yield thereof. At least some embodiments of the present disclosure further provide for techniques for manufacturing the package structure and an assembly structure.

Figure 2:
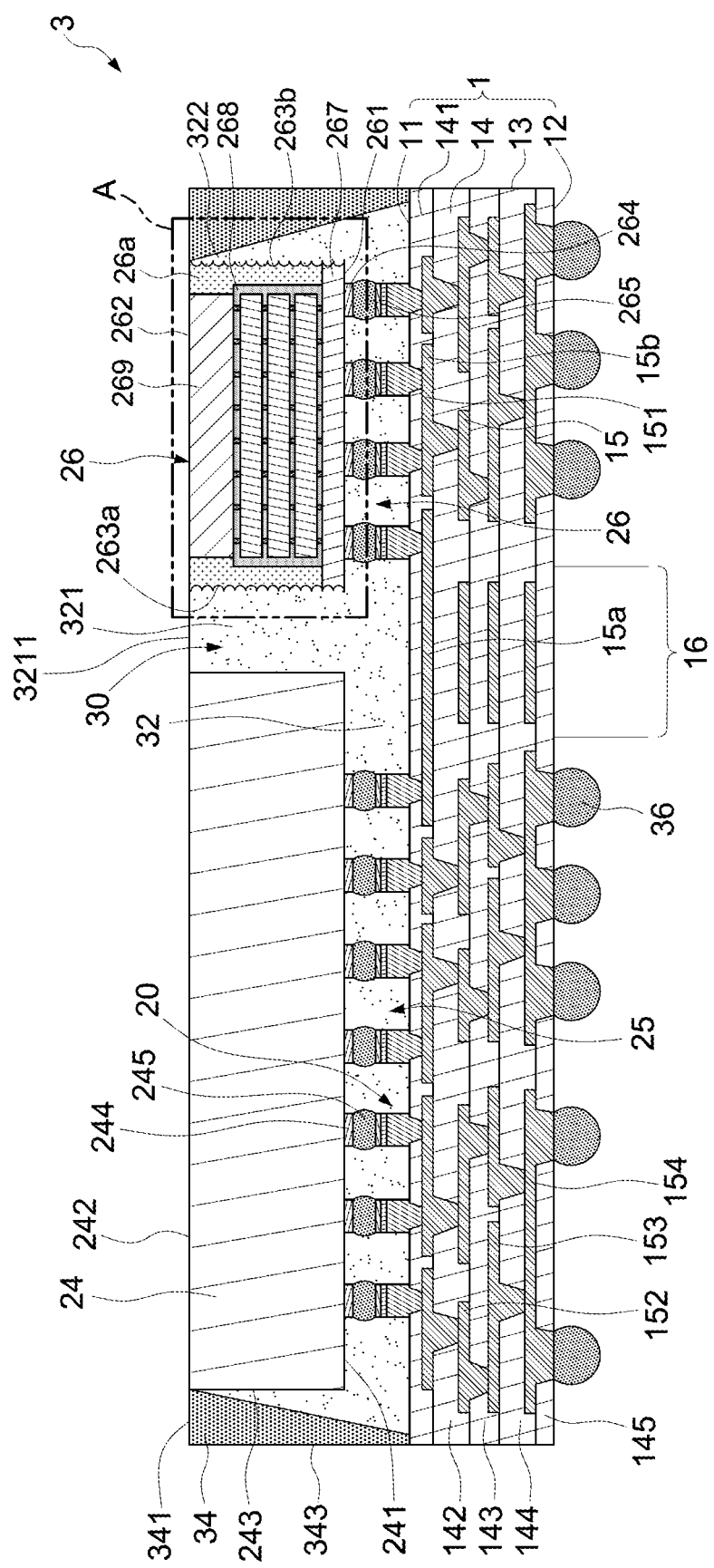
FIG. 2 illustrates a cross-sectional view taken along line 2-2 of the package structure of FIG. 1.
Figure 3:
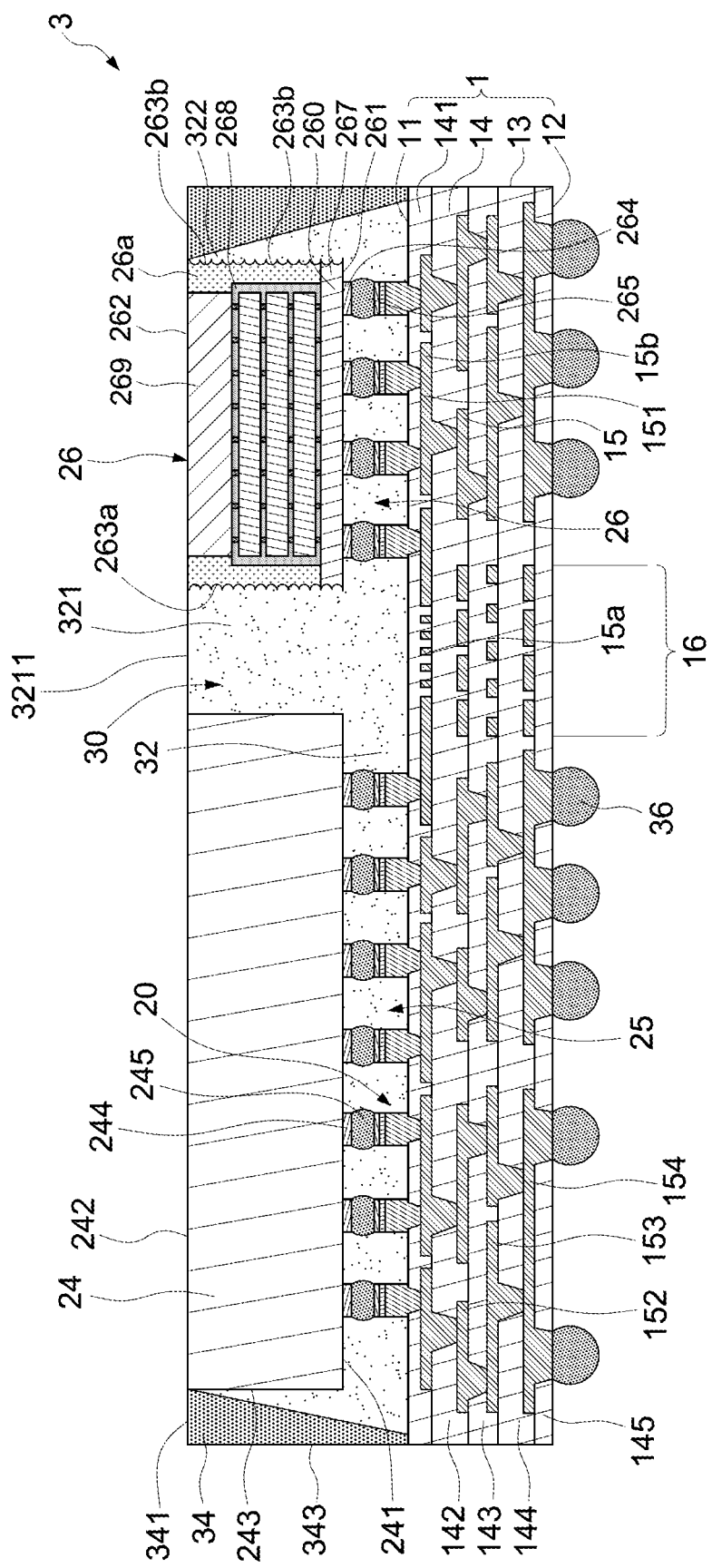
FIG. 3 illustrates a cross-sectional view taken along line 3-3 of the package structure of FIG. 1.
Figure 4:
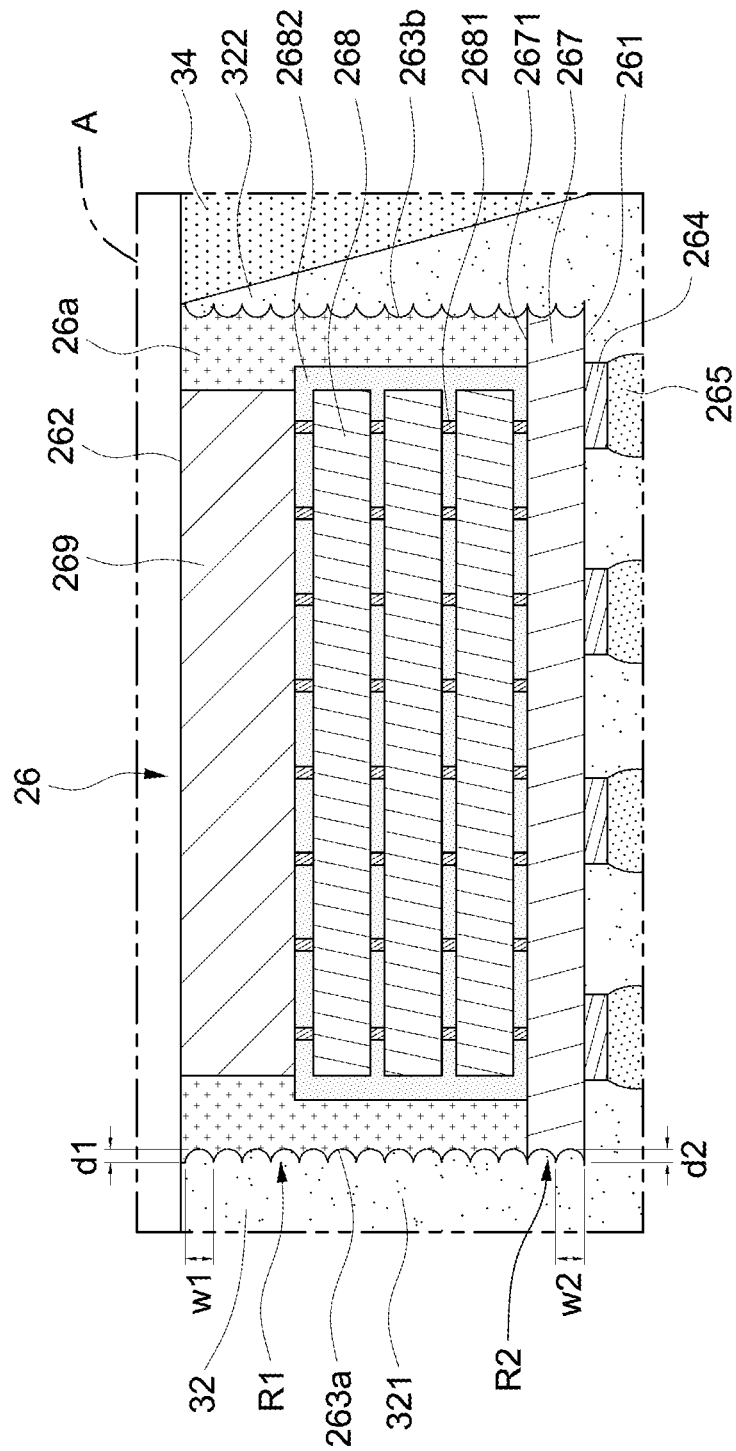
FIG. 4 illustrates an enlarged view of a region "A" in FIG. 2.

FIG. 1 illustrates a top view of a package structure 3 according to some embodiments of the present disclosure. FIG. 2 illustrates a cross-sectional view taken along line 2-2 of the package structure 3 of FIG. 1. FIG. 3 illustrates a cross-sectional view taken along line 3-3 of the package structure 3 of FIG. 1. FIG. 4 illustrates an enlarged view of a region "A" in FIG. 2. The package structure 3 includes a wiring structure 1, a plurality of protrusion pads 20, a first electronic device 24, a second electronic device 26, a protection material 32, a first encapsulant 34 and a plurality of solder materials 36. As shown in FIG. 1, the package structure 3 may include one first electronic device 24 and two second electronic devices 26. However, the amounts of the first electronic device(s) 24 and the second electronic device(s) 26 are not limited in the present disclosure.

As shown in FIG. 2 and FIG. 3, the wiring structure 1 has a first surface 11, a second surface 12 opposite to the first surface 11, a lateral side surface 13 extending between the first surface 11 and the second surface 12, and a high density region 16 (or a fine line region) between the first electronic device 24 and the second electronic device 26. The wiring structure 1 may include at least one dielectric layer 14, at least one circuit layer 15 in contact with the dielectric layer 14. For example, as shown in FIG. 2 and FIG. 3, the wiring structure 1 includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145. That is, the at least one dielectric layer 14 includes the first dielectric layer 141, the second dielectric layer 142, the third dielectric layer 143, the fourth dielectric layer 144 and the fifth dielectric layer 145. The at least one circuit layer 15 includes the first circuit layer 151, the second circuit layer 152, the third circuit layer 153 and the fourth circuit layer 154.

The first dielectric layer 141 may be a topmost dielectric layer or an outermost dielectric layer of the wiring structure 1. The first circuit layer 151 may be a topmost circuit layer or an outermost circuit layer of the wiring structure 1. A material of the first circuit layer 151 may include, for example, copper, another conductive metal, or an alloy thereof. A material of the first dielectric layer 141 may include an insulating material, a passivation material, a dielectric material or a solder resist material, such as, for example, a benzocyclobutene (BCB) based polymer or a polyimide (PI). In some embodiments, the first dielectric layer 141 may be made of a photoimageable material. In addition, the first surface 11 of the wiring structure 1 may be a top surface of the first dielectric layer 141. The first circuit layer 151 is disposed adjacent to the top surface of the first dielectric layer 141. In some embodiments, the first circuit layer 151 is embedded in the first dielectric layer 141, and is exposed from the top surface of the first dielectric layer 141. That is, the first dielectric layer 141 covers the first circuit layer 151, and defines a plurality of openings to expose portions of the first circuit layer 151.

Further, the first circuit layer 151 may include an interconnection portion 15a and a periphery portion 15b. The interconnection portion 15a is located in the high density region 16, and the periphery portion 15b is located outside the high density region 16 (e.g., a low density region). For example, the second electronic device 26 may be electrically connected to the first electronic device 24 through the interconnection portion 15a of the first circuit layer 151 of the wiring structure 1. The second electronic device 26 and the first electronic device 24 may be electrically connected to the solder materials 36 on the second surface 12 of the wiring structure 1 through the periphery portion 15b of the first circuit layer 151. A line width/line space (L/S) of the traces of the interconnection portion 15a may be less than an L/S of the traces of the periphery portion 15b. For example, an L/S of the traces of the interconnection portion 15a may be less than or equal to about 5 μm/about 5 μm, or less than or equal to about 2 μm/about 2 μm, or less than or equal to about 0.8 μm/about 0.8 μm. An L/S of the traces of the periphery portion 15b may be less than or equal to about 10 μm/about 10 μm, or less than or equal to about 7 μm/about 7 μm, or less than or equal to about 5 μm/about 5 μm.

The first dielectric layer 141 and the first circuit layer 151 may be disposed on the second dielectric layer 142. In addition, the second dielectric layer 142 may cover the second circuit layer 152. A portion (i.e., a via portion) of the first circuit layer 151 extends through the second dielectric layer 142 to electrically connect the second circuit layer 152. A material of the second dielectric layer 142 may be the same as or similar to the material of the first dielectric layer 141. The second circuit layer 152 may also include an interconnection portion located in the high density region 16, and a periphery portion located outside the high density region 16. In some embodiments, the via portion of the first circuit layer 151 may extend from the periphery portion, and they may be formed concurrently and integrally.

Similarly, the second dielectric layer 142 and the second circuit layer 152 may be disposed on the third dielectric layer 143. In addition, the third dielectric layer 143 may cover the third circuit layer 153. A portion (i.e., a via portion) of the second circuit layer 152 extends through the third dielectric layer 143 to electrically connect the third circuit layer 153. A material of the third dielectric layer 143 may be the same as or similar to the material of the second dielectric layer 142. The third circuit layer 153 may also include an interconnection portion located in the high density region 16, and a periphery portion located outside the high density region 16. In some embodiments, the via portion of the second circuit layer 152 may extend from the periphery portion, and they may be formed concurrently and integrally.

Similarly, the third dielectric layer 143 and the third circuit layer 153 may be disposed on the fourth dielectric layer 144. In addition, the fourth dielectric layer 144 may cover the fourth circuit layer 154. A portion (i.e., a via portion) of the third circuit layer 153 extends through the fourth dielectric layer 144 to electrically connect the fourth circuit layer 154. A material of the fourth dielectric layer 144 may be the same as or similar to the material of the third dielectric layer 143. The fourth circuit layer 154 may also include an interconnection portion located in the high density region 16, and a periphery portion located outside the high density region 16.

The fourth dielectric layer 144 and the fourth circuit layer 154 may be disposed on the fifth dielectric layer 145. A portion (i.e., a via portion) of the fourth circuit layer 154 extends through the fifth dielectric layer 145 to be exposed from a bottom surface of the fifth dielectric layer 145 (e.g., the second surface 12 of the wiring structure 1). A material of the fifth dielectric layer 145 may be the same as or similar to the material of the fourth dielectric layer 144. As shown in FIG. 2 and FIG. 3, the second electronic device 26 may be electrically connected to the first electronic device 24 through the interconnection portion 15a of the circuit layer 15 (including, for example, the interconnection portions 15a of the first circuit layer 151, the second circuit layer 152, the third circuit layer 153 and the fourth circuit layer 154). The second electronic device 26 and the first electronic device 24 may be electrically connected to the solder materials 36 through the via portions of the periphery portion 15b of the circuit layer 15 (including, for example, the periphery portions 15b of the first circuit layer 151, the second circuit layer 152, the third circuit layer 153 and the fourth circuit layer 154).

The protrusion pads 20 may be disposed on and protrude from the first dielectric layer 141 (i.e., the topmost dielectric layer or the outermost dielectric layer) of the wiring structure 1. The protrusion pads 20 may be disposed on and protrude from the first surface 11 of the wiring structure 1, and extend through the first dielectric layer 141 (i.e., the topmost dielectric layer or the outermost dielectric layer) to electrically connect the first circuit layer 151.

The first electronic device 24 and the second electronic device 26 are disposed adjacent to or disposed on the first surface 11 of the wiring structure 1 side by side, and are electrically connected to the circuit layer 15 of the wiring structure 1. The first electronic device 24 may be a semiconductor device such as an application specific integrated circuit (ASIC) die. As shown in FIG. 2 and FIG. 3, the first electronic device 24 may have a first active surface 241, a first backside surface 242 opposite to the first active surface 241, and a lateral side surface 243 extending between the first active surface 241 and the first backside surface 242. Further, the first electronic device 24 may include a plurality of first electrical contacts 244 disposed adjacent to the first active surface 241. The first electrical contacts 244 may be exposed or may protrude from the first active surface 241 for electrical connection. The first electrical contacts 244 may be pads, bumps, studs, pillars or posts. In some embodiments, the first electrical contacts 244 of the first electronic device 24 may be electrically connected and bonded to the protrusion pads 20 through a plurality of solder materials 245. For example, the first electrical contacts 244 may include copper, gold, platinum, and/or other suitable material.

The second electronic device 26 may be a semiconductor device such as high bandwidth memory (HBM) die. As shown in FIG. 2 and FIG. 3, the second electronic device 26 may have a second active surface 261, a second backside surface 262 (i.e., a top surface) opposite to the second active surface 261, a first lateral side surface 263*a* extending between the second active surface 261 and the second backside surface 262, and a second lateral side surface 263*b* opposite to the first lateral side surface 263*a*. The first lateral side surface 263*a* faces toward the first electronic device 24, while the second lateral side surface 263*b* faces away from the first electronic device 24. Further, the second electronic device 26 may include a plurality of second electrical contacts 264 disposed adjacent to the second active surface 261. The second electrical contacts 264 may be exposed or may protrude from the second active surface 261 for electrical connection. The second electrical contacts 264 may be pads, bumps, studs, pillars or posts. In some embodiments, the second electrical contacts 264 of the second electronic device 26 may be electrically connected and bonded to the protrusion pads 20 through a plurality of solder materials 265. For example, the second electrical contacts 264 may include copper, gold, platinum, and/or other suitable material. As shown in FIG. 4, the second electronic device 26 may include a basic die 267 (e.g., a first die or a logic die), a plurality of memory dice 268 (e.g., a plurality of second dice), a block die 269 (e.g., a third die or a dummy die), and a second encapsulant 26*a*. The memory dice 268 may be stacked on a top surface 2671 of the basic die 267 and electrically connected to the basic die 267. A size of the memory dice 268 is less than a size of the basic die 267. The block die 269 may be stacked on the memory dice 268. The second encapsulant 26*a* may cover a portion of the top surface 2671 of the basic die 267, the memory dice 268, and the block die 269. A material of the second encapsulant 26*a* may be a molding compound with or without fillers.

As shown in FIG. 2 and FIG. 3, the protection material 32 (i.e., an underfill) may be disposed in a first space 25 between the first electronic device 24 and the wiring structure 1 so as to cover and protect the joints formed by the electrical contacts 244, the protrusion pads 20 and the solder materials 245. Further, the protection material 32 may be disposed in a second space 26 between the second electronic device 26 and the wiring structure 1 so as to cover and protect the joints formed by the electrical contacts 264, the protrusion pads 20 and the solder materials 265. In addition, the protection material 32 may include a first portion 321, and a second portion 322. The first portion 321 of the protection material 32 may further extend into a gap 30 between the first electronic device 24 and the second electronic device 26. Alternatively, the first portion 321 of the protection material 32 may completely fill the gap 30, and may have a top surface 3211 substantially coplanar with the first backside surface 242 of the first electronic device 24 and the second backside surface 262 of the second electronic device 26. The first portion 321 of the protection material 32 may be disposed on the first lateral side surface 263*a* of the second electronic device 26. The second portion 322 of the protection material 32 may extend to or may be disposed on the second lateral side surface 263*b* of the second electronic device 26.

FIG. 4 includes further details of the region "A" in FIG. 2. The memory dices 268 are electrically connected with each other through a plurality of connection structures 2681. The memory dices 268 may be electrically connected with the block die 269 through a plurality of connection structures 2681. The memory dices 268 are electrically connected with the basic die 267 through a plurality of connection structures 2681. The memory dice 268 and the connection structures 2681 are covered by an adhesive layer 2682. The adhesive layer 2682 includes a plurality of portions disposed between the memory dice 268. The adhesive layer 2682 further includes a portion disposed between the block die 269 and the topmost one of the memory dice 268, and another portion disposed between the basic die 267 and the lowermost one of the memory dice 268. A material of the adhesive layer 2682 may include, for example, a non-conductive film or paste.

As shown in FIG. 4, the second electronic device 26 defines a plurality of recesses (including, for example, first recesses R1 and second recesses R2) on the first lateral side surface 263*a* thereof. The plurality of recesses is substantially parallel with the second backside surface 262 of the second electronic device 26. The recesses may include a plurality of first recesses R1 on a lateral side surface of the second encapsulant 26*a* and a plurality of second recesses R2 on a lateral side surface of the basic die 267. A size of the first recess R1 may be the same as that of the second recess R2. Alternatively, a size of the first recess R1 may be different from (e.g., smaller than or larger than) that of the second recess R2. The first portion 321 of the protection material 32 may cover the lateral side surface of the second encapsulant 26*a* and the lateral side surface of the basic die 267 (e.g., the lateral side surface 263*a* of the second electronic device 26). The first portion 321 of the protection material 32 may encapsulate the plurality of first recesses R1 and the plurality of second recesses R2. As such, the contact area between the second encapsulant 26*a* and the protection material 32 as well as the basic die 267 and the protection material 32 may be increased. The larger contact area improves the adhesion and bonding strength therebetween. In other words, the recesses (e.g., the first recesses R1 and the second recesses R2) function as mold locks to fasten or seize the protection material 32. Hence, the mold-lock-like recesses on the lateral side surface 263*a* of the second electronic device 26 prevent delamination or cracks in the heterojunctions of the second electronic device 26 and the protection material 32 induced by warpage which occurs during the thermal process. In addition, the mold-lock-like recesses on the lateral side surface 263*a* of the second electronic device 26 may also prevent or reduce the delamination between the second encapsulant 26*a* and the basic die 267 on the top surface 2671 of the basic die 267.

Still referring to FIG. 4, the first recesses R1 and the second recesses R2 may have particular shapes or patterns generated by an etching process, e.g., a plasma etching process. The first recesses R1 and the second recesses R2 are continuously distributed along the first lateral side surface 263*a* of the second electronic device 26. The first recesses R1 and the second recesses R2 may each have a concave shape. The concave shape of the first recesses R1 has a first depth d1 and a first width w1. The first depth d1 is in a range from about 40 nm to about 75 nm. The first width w1 is in a range from about 150 nm to about 400 nm. The ratio of the first width w1 to the first depth d1 is in a range from about 3 to about 5. The concave shape of the second recesses R2 has a second depth d2 and a second width w2. The second depth d2 may be similar to or different from the first depth d1. The second width w2 may be similar to or different from the first width w1. As shown in FIG. 4, the second electronic device 26 defines another plurality of recesses on the second lateral side surface 263*b* thereof, which is similar to or the same as the plurality of recesses on the first lateral side surface 263*a* of the second electronic device 26.

Again referring to FIG. 1, the second electronic device 26 further defines a plurality of recesses (e.g., a plurality of third recesses R3) on the first lateral side surface 263*a*. Thus, the recesses (e.g. the third recesses R3) faces toward the first electronic device 24. The third recess R3 are substantially perpendicular to the second backside surface 262 of the second electronic device 26. Thus, the third recess R3 are substantially perpendicular to the first recesses R1 and the second recesses R2. The second electronic device 26 may also define a plurality of third recesses on the second lateral side surface 263b similar to those on the first lateral side surface 263a.

Figure 5:
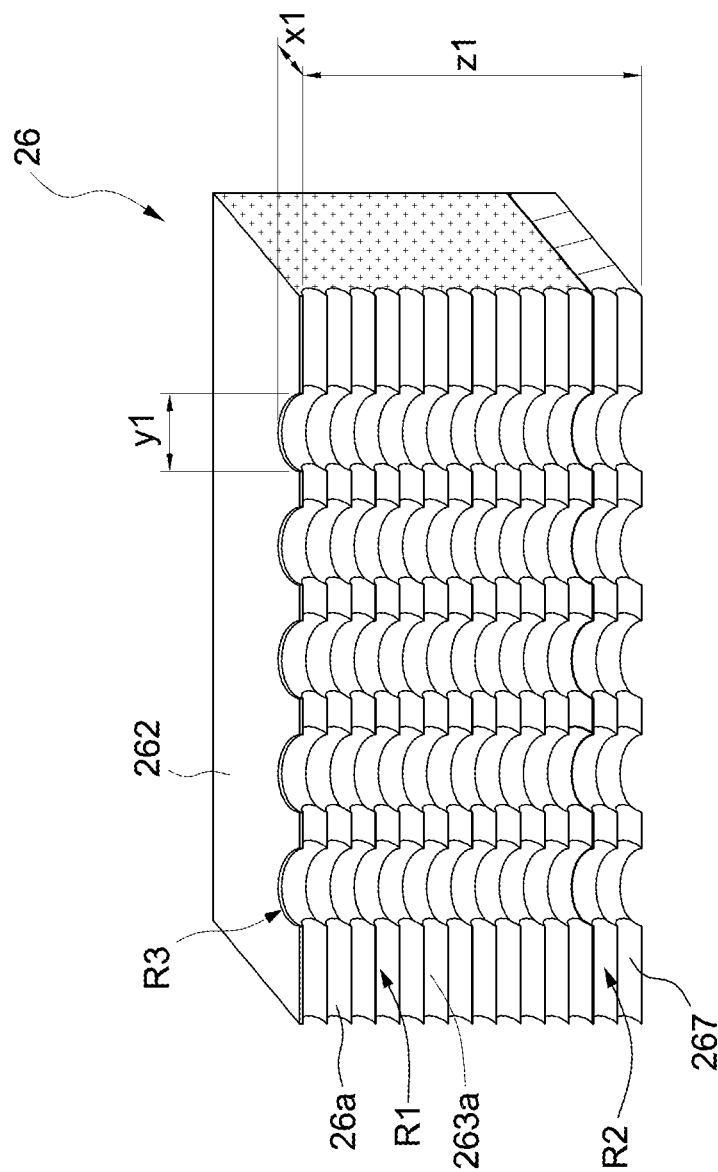
FIG. 5 illustrates a schematic perspective view of a edge of an electronic device according to some embodiments of the present disclosure.

FIG. 5 illustrates a schematic perspective view of an edge of the second electronic device 26 of FIG. 1. As shown in FIG. 5, the third recesses R3 may intersect the first recesses R1 and the second recesses R2. As such, the first lateral side surface 263a may have a surface roughness from about 0.01 μm to about 8 μm, resulting from the topography generated by the recesses (including the first recesses R1, the second recesses R2 and the third recesses R3). The lateral side surface 263a of the second electronic device 26 with the relatively large surface roughness grips the protection material 32 to prevent delamination or cracks in the heterojunctions of the second electronic device 26 and the protection material 32 induced by warpage which occurs during the thermal process.

As shown in FIG. 5, the third recess R3 has a depth x1, a width y1, and a length z1. The depth x1 is in a range from about 1 μm to about 100 μm. The width y1 is in a range from about 1 μm to about 51 mm. The length z1 is in a range from about 50 μm to about 400 μm. Depending on the design of practical products, the depth x1, the width y1, and the length z1 may be in a domain different from the above-mentioned ranges.

Again referring to FIG. 2 and FIG. 3, the first encapsulant 34 covers at least portions of the protection material 32. A material of the first encapsulant 34 may be a molding compound with or without fillers. The first encapsulant 34 has a first surface 341 (e.g., a top surface) and a lateral side surface 343. As shown in FIG. 2 and FIG. 3, the first surface 341 of the encapsulant 34, the first backside surface 242 of the first electronic device 24, the top surface 3211 of the protection material 32 and the second backside surface 262 of the second electronic device 26 may be substantially coplanar with each other. In addition, the lateral side surface 343 of the first encapsulant 34 may be substantially coplanar with the lateral side surface 13 of the wiring structure 1.

The solder materials 36 (e.g., solder balls) may be disposed adjacent to the second surface 12 of the wiring structure 1 for external connection. As shown in FIG. 2 and FIG. 3, the solder materials 36 are disposed on the exposed portions (i.e., the bottom portions of the via portions) of the fourth circuit layer 154.

Figure 6B:
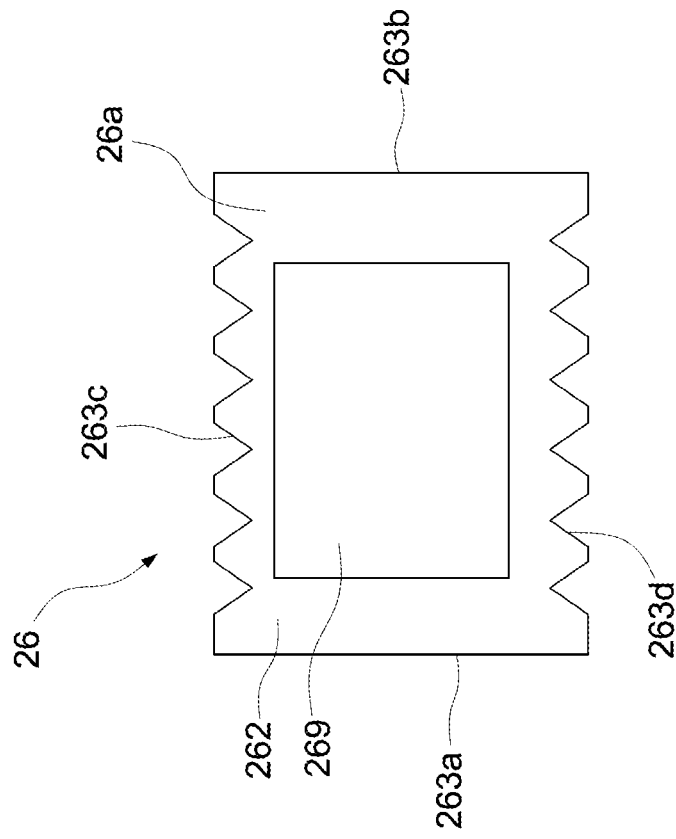
FIG. 6B illustrates a top view of the second electronic device according to some embodiments of the present disclosure.
Figure 6A:
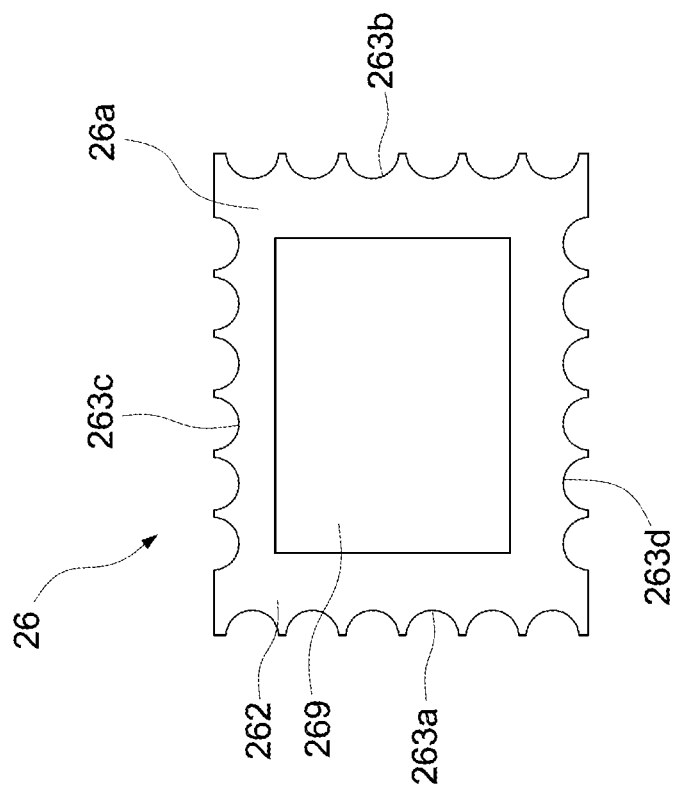
FIG. 6A illustrates a top view of the second electronic device according to some embodiments of the present disclosure.

FIGS. 6A, 6B, 6C, 6D illustrate various top views of the second electronic device 26 according to some embodiments of the present disclosure. The second electronic device 26 may include different patterns on the second backside surface 262 as shown in FIGS. 6A, 6B, 6C, and 6D. In FIG. 6A, the second electronic device 26 defines a plurality of recesses with curved shapes on the four lateral side surfaces 263a, 263b, 263c, and 263d from a top view. In some embodiments, the corners between adjoined lateral side surfaces (e.g., the lateral side surfaces 263a and 263c) may have a relatively smooth shape to relieve the stress. In FIG. 6B, the second electronic device 26 defines a plurality of recesses with triangular shapes on the lateral side surfaces 263c and 263d. In FIG. 6C, the second electronic device 26 defines a plurality of recesses with rectangular shapes on the lateral side surfaces 263b and 263c. In FIG. 6D, the second electronic device 26 defines a plurality of recesses with trapezoidal shapes on the lateral side surfaces 263a, 263b, 263c, and 263d.

Figure 7:
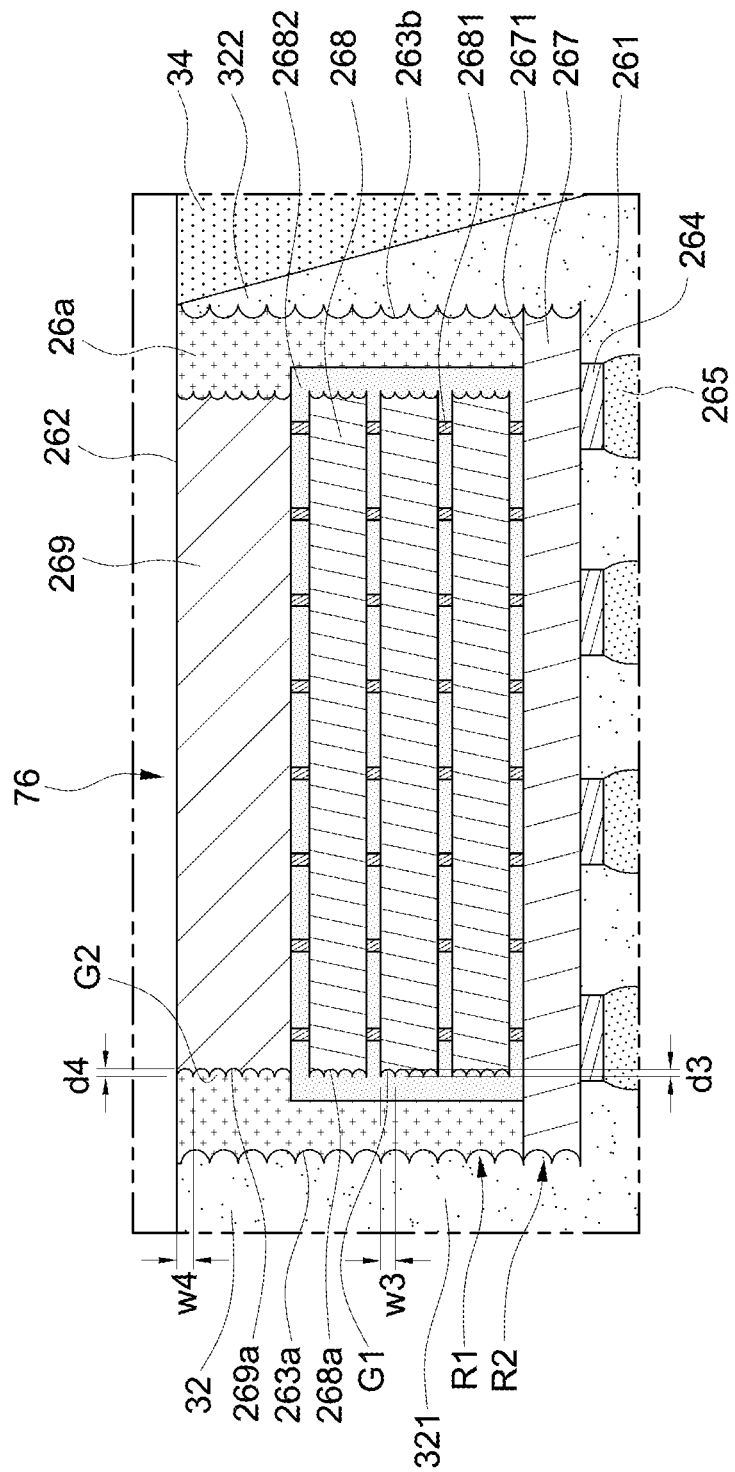
FIG. 7 illustrates an enlarged view of a region of a package structure according to some embodiments of the present disclosure.

FIG. 7 illustrates an enlarged view of a region of a package structure according to some embodiments of the present disclosure. The region of FIG. 7 is similar to the region "A" of FIG. 4, except for a structure of the second electronic device 76. In the second electronic device 76 of FIG. 7, the memory dice 268 defines a plurality of first grooves G1 on a lateral side surface 268a thereof, and the block die 269 defines a plurality of second grooves G2 on a lateral side surface 269a thereof. A size of the first groove G1 may be similar to or different from that of the second grooves G2. The adhesive layer 2682 may encapsulate the first grooves G1. The second encapsulant 26a may encapsulate the second grooves G2. As such, the contact area between the second encapsulant 26a and the block die 269 as well as the adhesive layer 2682 and the memory dice 268 may be increased. The larger contact area improves the adhesion and bonding strength therebetween. In other words, the plurality of first grooves G1 functions as mold locks to fasten or seize the adhesive layer 2682, and the plurality of second grooves G2 functions as mold locks to fasten or grip the second encapsulant 26a. Hence, the mold-lock-like grooves (e.g., the plurality of first grooves G1 and the plurality of second grooves G2) prevent delamination or cracks in the heterojunctions within the second electronic device 76 induced by warpage which occurs during the thermal process.

Still referring to FIG. 7, the first grooves G1 and the second grooves G2 may have particular shapes or patterns generated by an etching process, e.g., a plasma etching process. The first grooves G1 are continuously distributed along the lateral side surface 268a of the memory dice 268. The second grooves G2 are continuously distributed along the lateral side surface 269a of the block die 269. The first grooves G1 and the second grooves G2 may each have a concave shape. The concave shape of the first grooves G1 has a third depth d3 and a third width w3. The concave shape of the second grooves G2 has a fourth depth d4 and a fourth width w4. The fourth depth d4 may be similar to or different from the third depth d3. The fourth width w4 may be similar to or different from the third width w3.

Figure 8:
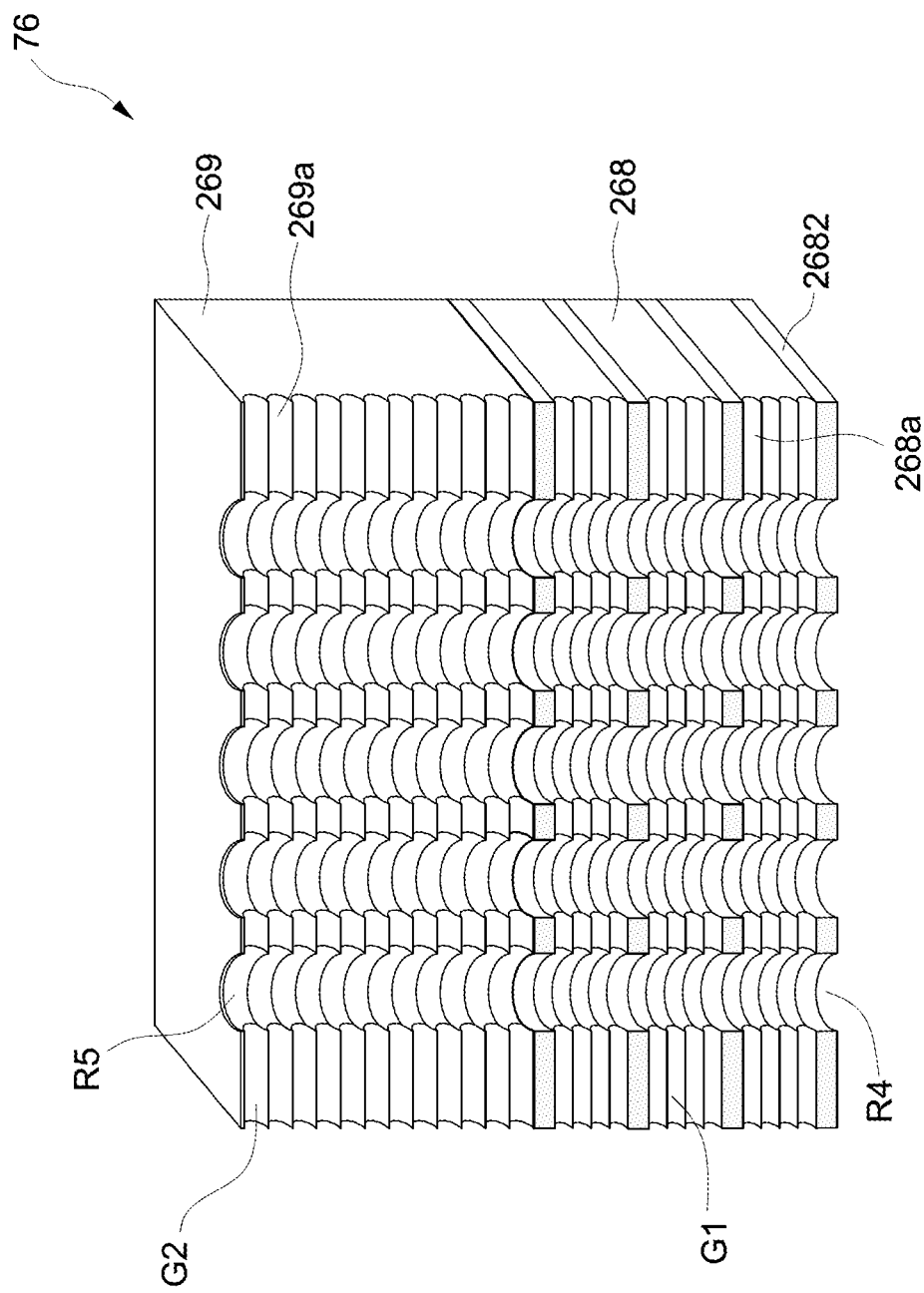
FIG. 8 illustrates a schematic perspective view of the second electronic device of FIG. 7, wherein the basic die, the second encapsulant and the adhesive layer are omitted.

FIG. 8 illustrates a schematic perspective view of the second electronic device 76 of FIG. 7, wherein the basic die 267, the second encapsulant 26a and the adhesive layer 2682 are omitted. The memory dice 268 each defines a plurality of fourth recesses R4 on the lateral side surface 268a. The fourth recesses R4 may intersect the first grooves G1. As such, the lateral side surface 268a may have a relatively large surface roughness to grip the adhesive layer 2682 to prevent delamination or cracks in the heterojunctions within the second electronic device 76 induced by warpage which occurs during the thermal process. Still referring to FIG. 8, the block die 269 defines a plurality of fifth recesses R5 on the lateral side surface 269a. The fifth recesses R5 may intersect the second grooves G2. As such, the lateral side surface 269a may have a relatively large surface roughness to grip the second encapsulant 26a to prevent delamination or cracks in the heterojunctions within the second electronic device 76 induced by warpage which occurs during the thermal process.

Figure 9:
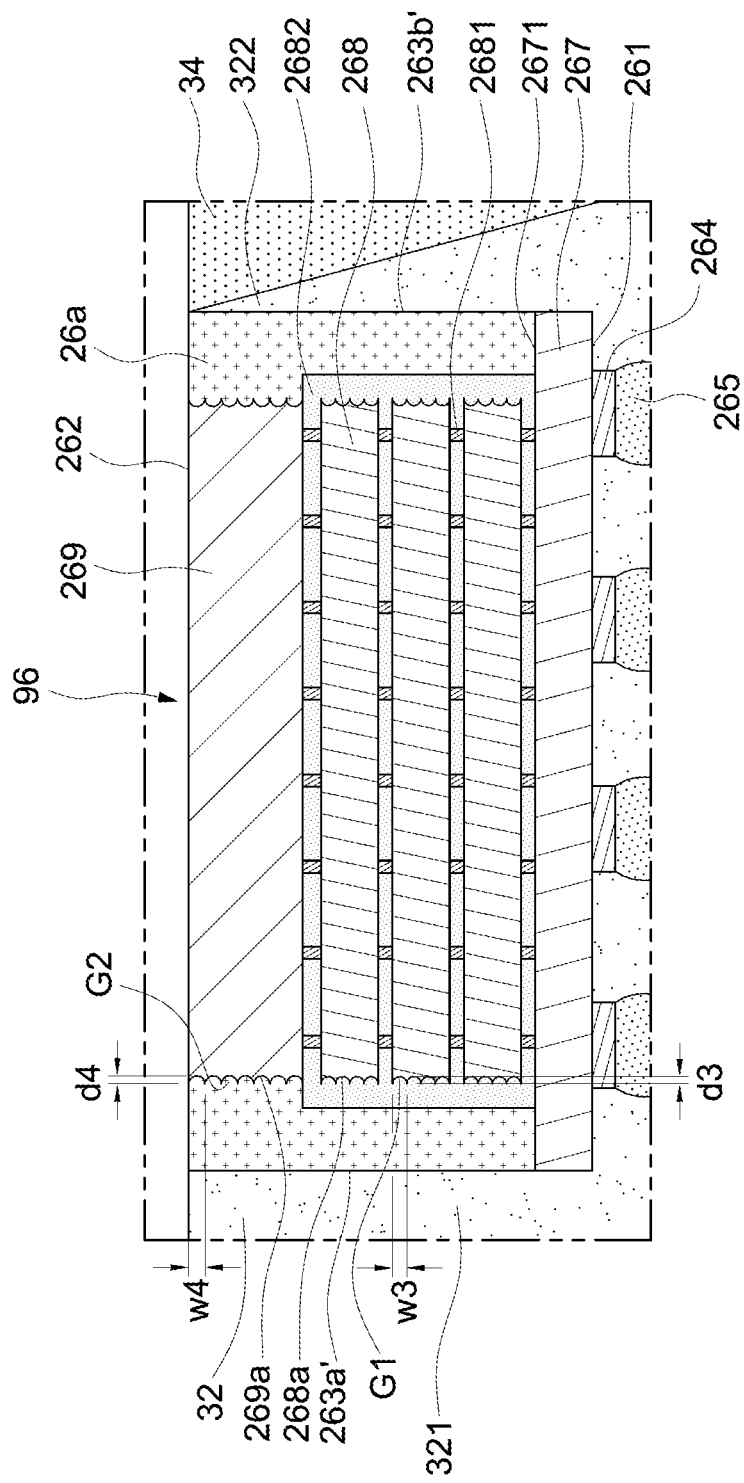
FIG. 9 illustrates an enlarged view of a region of a package structure according to some embodiments of the present disclosure.

FIG. 9 illustrates an enlarged view of a region of a package structure according to some embodiments of the present disclosure. The region of FIG. 9 is similar to the region of FIG. 7, except that the lateral side surfaces of the second electronic device 96 (e.g., a first lateral side surface 263a' and a second lateral side surface 263b') are free from recesses in the cross-section view. Thus, the lateral side surfaces of the second electronic device 96 (e.g., the first lateral side surface 263a' and the second lateral side surface 263b') may be substantially flat.

Figure 10:
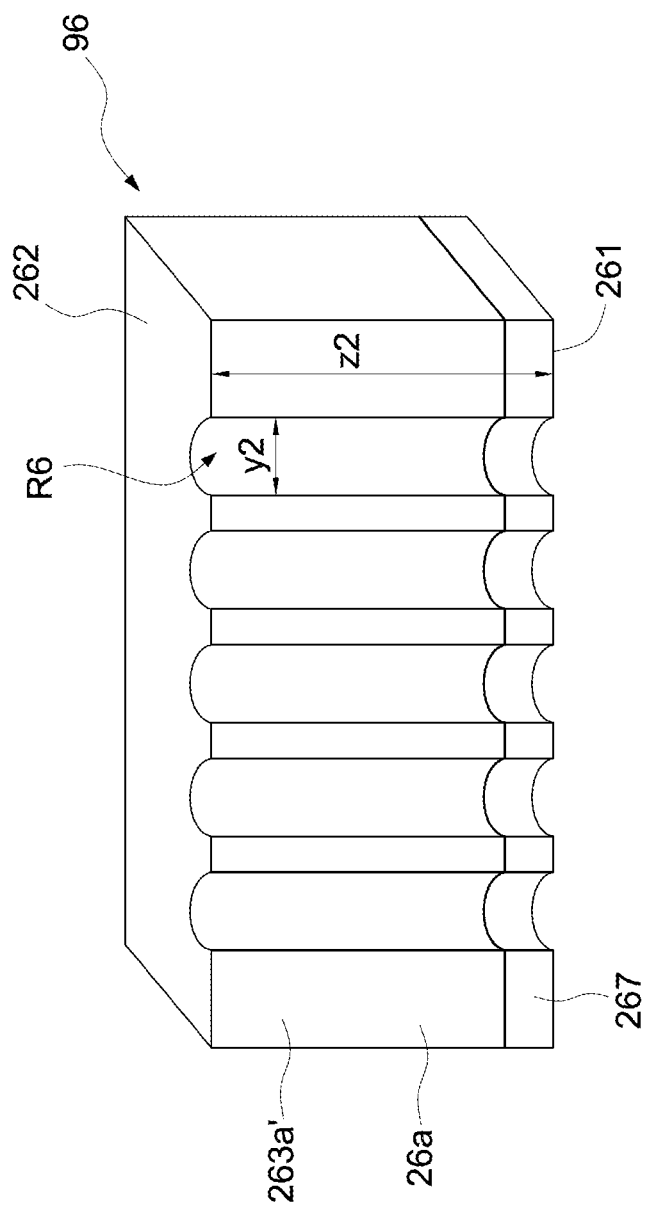
FIG. 10 illustrates another schematic perspective view of a edge of an electronic device according to some embodiments of the present disclosure.

FIG. 10 illustrates another schematic perspective view of an edge of an electronic device (e.g., the second electronic device 96 in FIG. 9) according to some embodiments of the present disclosure. As shown in FIG. 10, the second electronic device 96 may define a plurality of sixth recesses R6 on the first lateral side surface 263a'. The sixth recesses R6 extend from a top surface 262 to a bottom surface 261 of the second electronic device 96. As such, the first lateral side surface 263a' of the second electronic device 96 may have a surface roughness of about 1 resulting from the topography generated by the sixth recesses R6. The first lateral side surface 263a' of the second electronic device 96 with the relatively large surface roughness grips the protection material 32 to prevent delamination or cracks in the heterojunctions of the second electronic device 96 and the protection material 32 induced by warpage which occurs during the thermal process.

As shown in FIG. 10, the sixth recess R6 has a width y2, and a length z2. The width y2 is in a range from about 10 μm to about 100 The length z2 is in a range from about 10 μm to about 200 Depending on the design of practical products, the width y2 and the length z2 may be in a domain different from the above-mentioned ranges.

Figure 11:
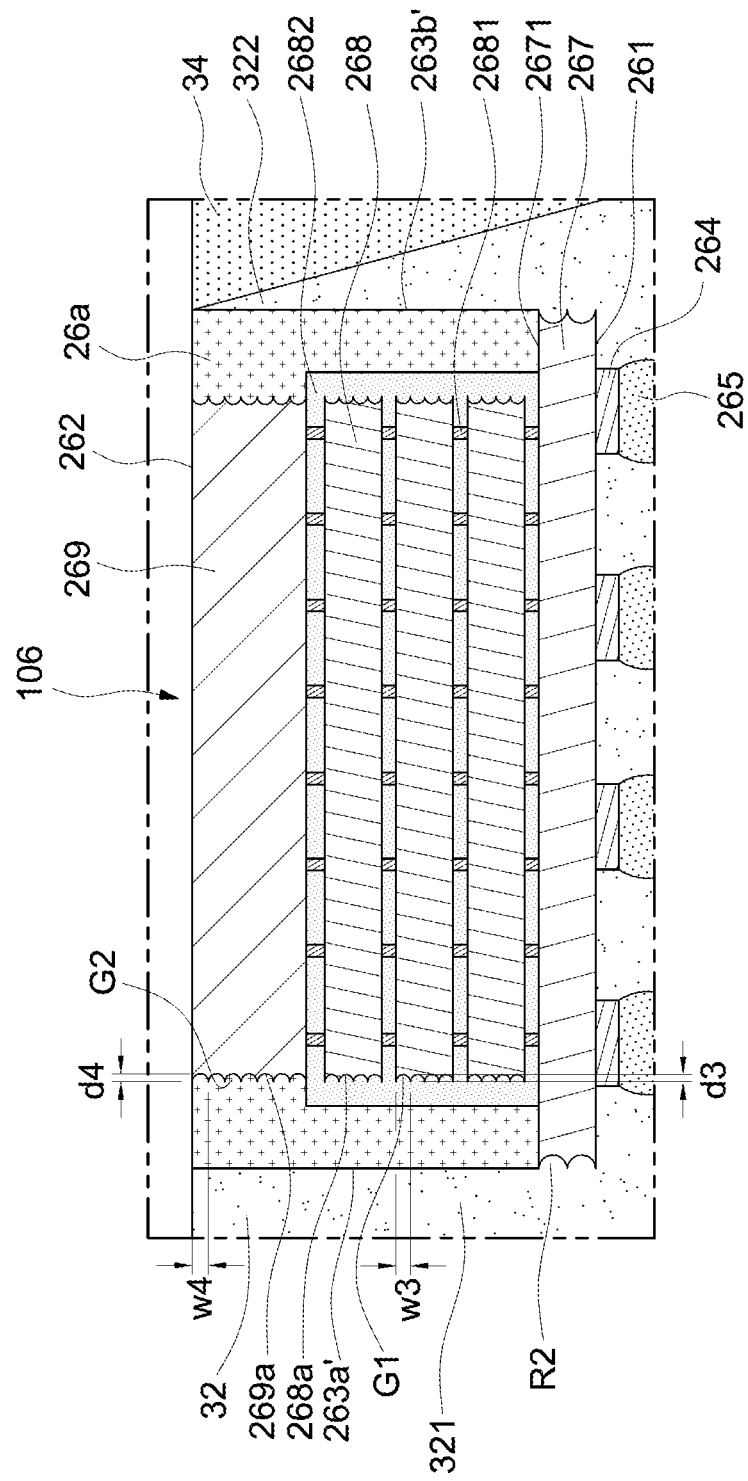
FIG. 11 illustrates an enlarged view of a region of a package structure according to some embodiments of the present disclosure.

FIG. 11 illustrates an enlarged view of a region of a package structure according to some embodiments of the present disclosure. The region of FIG. 11 is similar to the region of FIG. 7, except that the lateral side surface of the second encapsulant 26a is free from recesses in the cross-section view. Thus, the lateral side surface of the second encapsulant 26a may be substantially flat.

Figure 12:
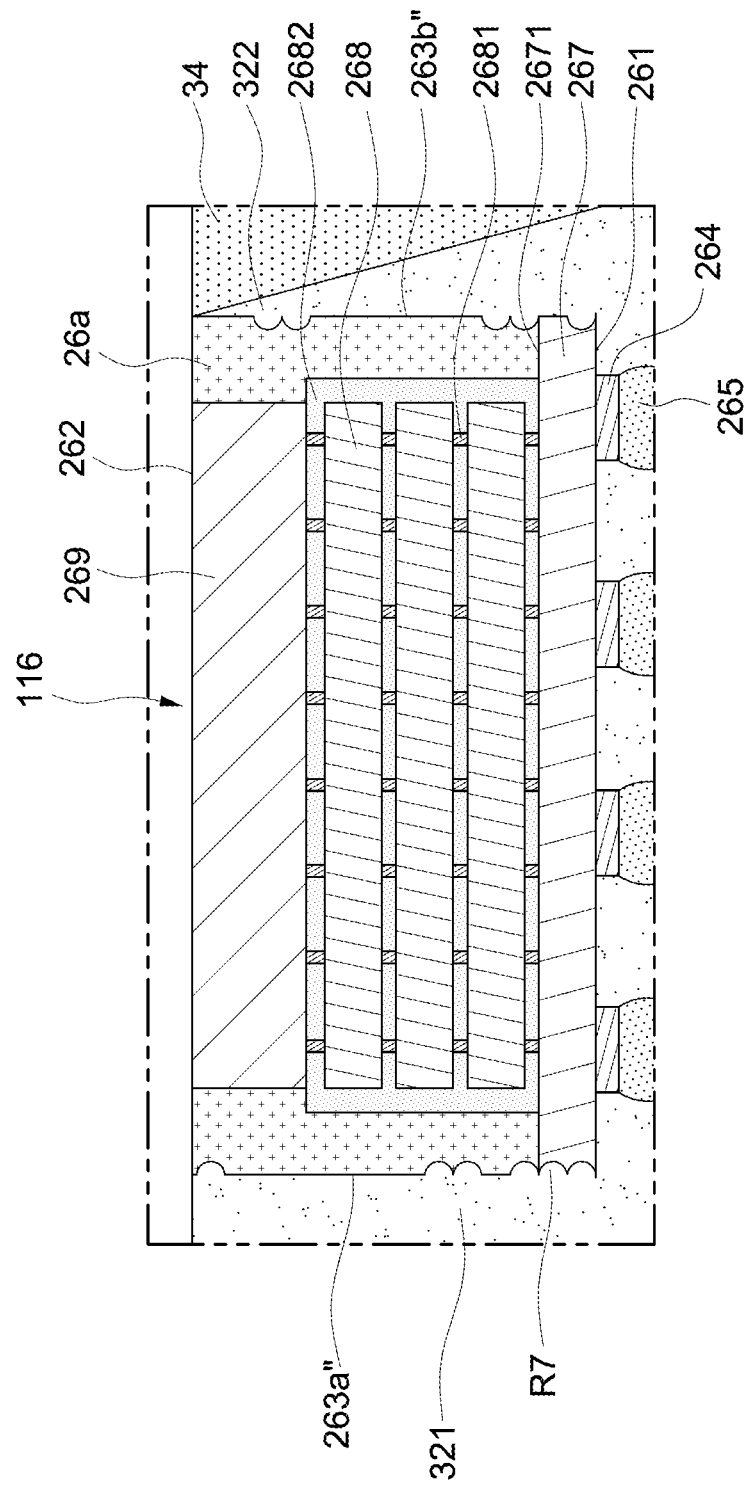
FIG. 12 illustrates an enlarged view of a region of a package structure according to some embodiments of the present disclosure.

FIG. 12 illustrates an enlarged view of a region of a package structure according to some embodiments of the present disclosure. The region of FIG. 12 is similar to the region "A" of FIG. 4, except for a structure of the second electronic device 116. As shown in FIG. 12, the second electronic device 116 defines a plurality of recesses (e.g., a plurality of seventh recesses R7) on a first lateral side surface 263a" and/or a second lateral side surface 263b" thereof. The plurality of seventh recesses R7 of the second electronic device 116 are randomly distributed along the first lateral side surface 263a" and/or the second lateral side surface 263b" of the second electronic device 116. In some embodiments, the plurality of seventh recesses R7 may be formed by an etching process, i.e., a blast process.

Figure 13:
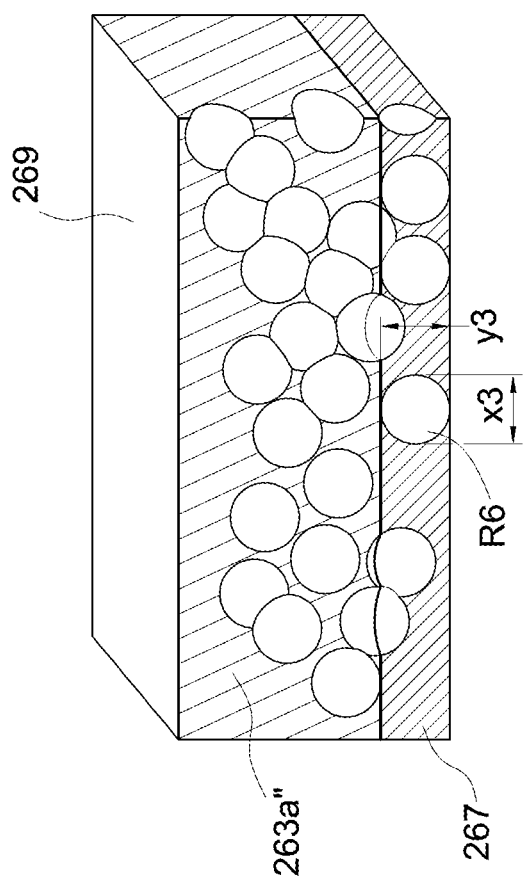
FIG. 13 illustrates another schematic perspective view of a edge of an electronic device according to some embodiments of the present disclosure.

FIG. 13 illustrates another schematic perspective view of an edge of an electronic device (e.g., the second electronic device 116 in FIG. 12) according to some embodiments of the present disclosure. As shown in FIG. 13, the plurality of seventh recesses R7 are randomly distributed on the first lateral side surface 263a" of the second electronic device 116. As such, the lateral side surface of the second electronic device 116 may have a surface roughness from about 3 μm to about 8 resulting from the topography generated by the plurality of seventh recesses R7. The first lateral side surface 263a" of the second electronic device 116 with the relatively large surface roughness grips the protection material 32 to prevent delamination or cracks in the heterojunctions of the second electronic device 116 and the protection material 32 induced by warpage which occurs during the thermal process.

As shown in FIG. 13, the seventh recess R7 has a width y3, and a length z3. The width y3 is in a range from about 0.45 mm to about 0.70 mm. The width z3 is in a range from about 0.45 mm to about 0.70 mm. Depending on the design of practical products, the width y3 and the length z3 may be in a domain different from the above-mentioned ranges.

Figure 14:
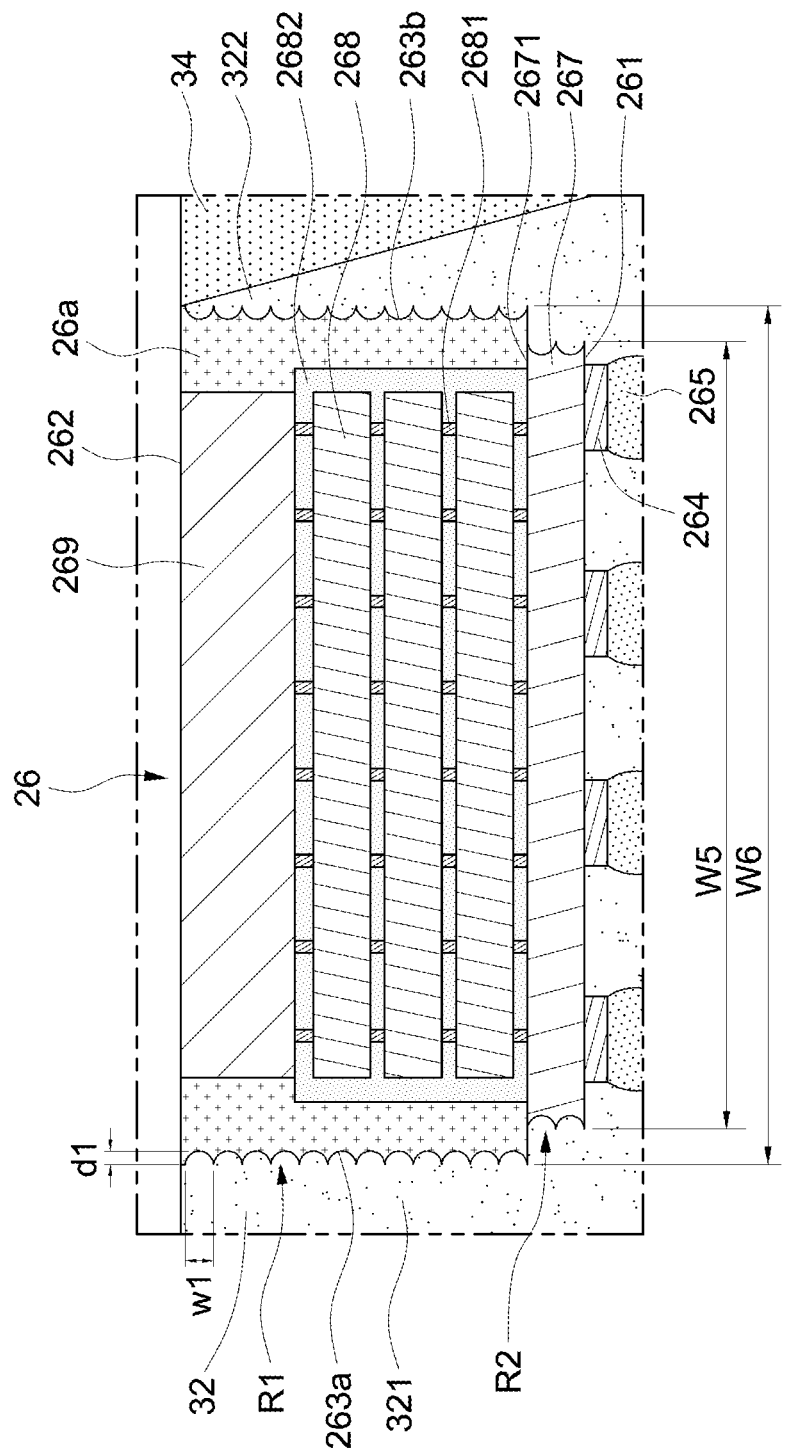
FIG. 14 illustrates an enlarged view of a region of a package structure according to some embodiments of the present disclosure.

FIG. 14 illustrates an enlarged view of a region of a package structure according to some embodiments of the present disclosure. The region of FIG. 14 is similar to the region "A" of FIG. 4, except that a width W5 of the basic die 267 is different from a width W6 of the encapsulant 26a. As shown in FIG. 14, the width W5 of the basic die 267 is smaller than the width W6 of the encapsulant 26a. The difference between the width W5 of the basic die 267 and the width W6 of the encapsulant 26a may be resulted from the etching rate difference during the singulation of the electronic device 26.

Figure 15:
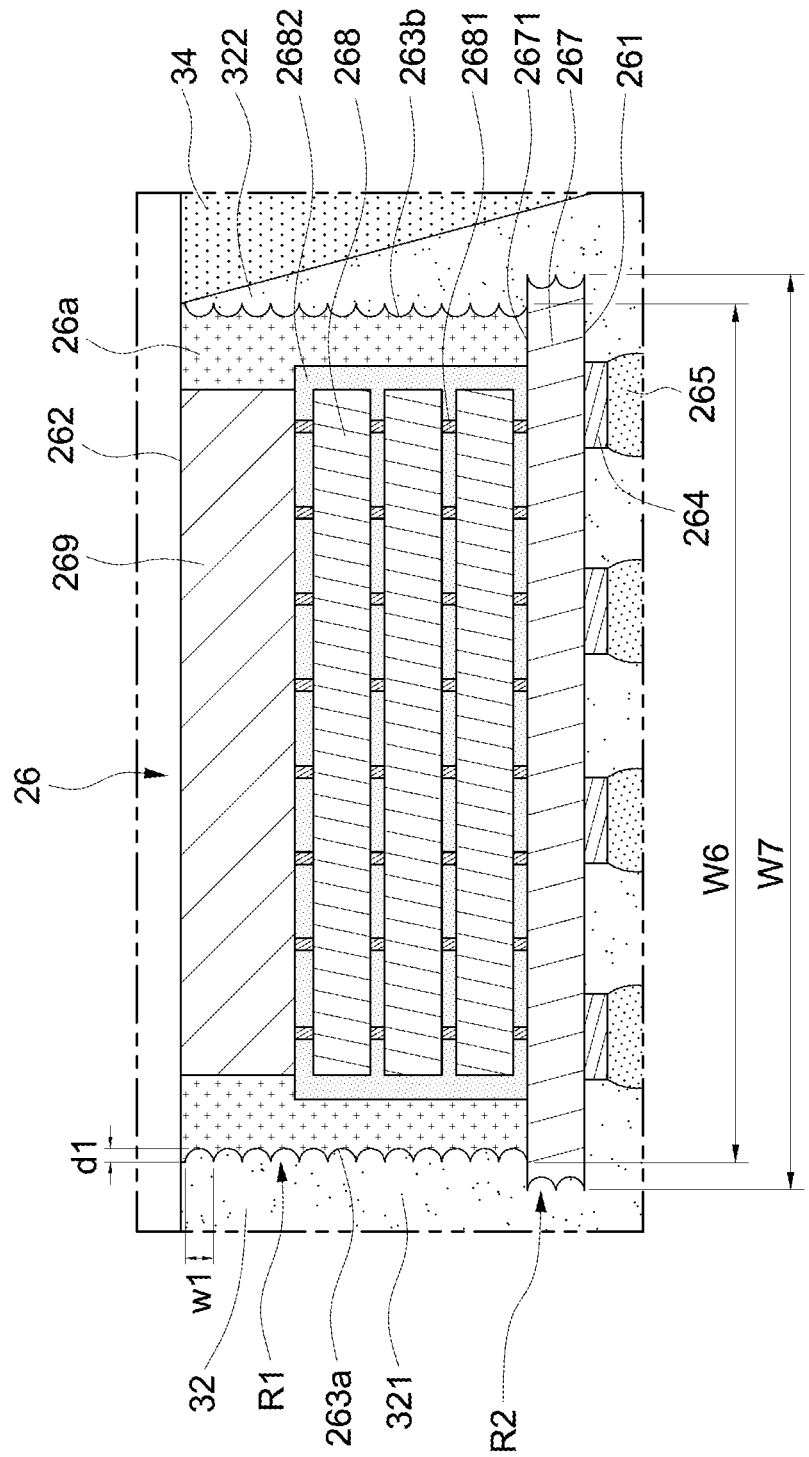
FIG. 15 illustrates an enlarged view of a region of a package structure according to some embodiments of the present disclosure.

FIG. 15 illustrates an enlarged view of a region of a package structure according to some embodiments of the present disclosure. The region of FIG. 15 is similar to the region "A" of FIG. 4, except that a width W7 of the basic die 267 is different from a width W6 of the encapsulant 26a. As shown in FIG. 15, the width W7 of the basic die 267 is greater than the width W6 of the encapsulant 26a. The difference between the width W7 of the basic die 267 and the width W6 of the encapsulant 26a may be resulted from etching rate difference during the singulation of the electronic device 26.

Figure 16:
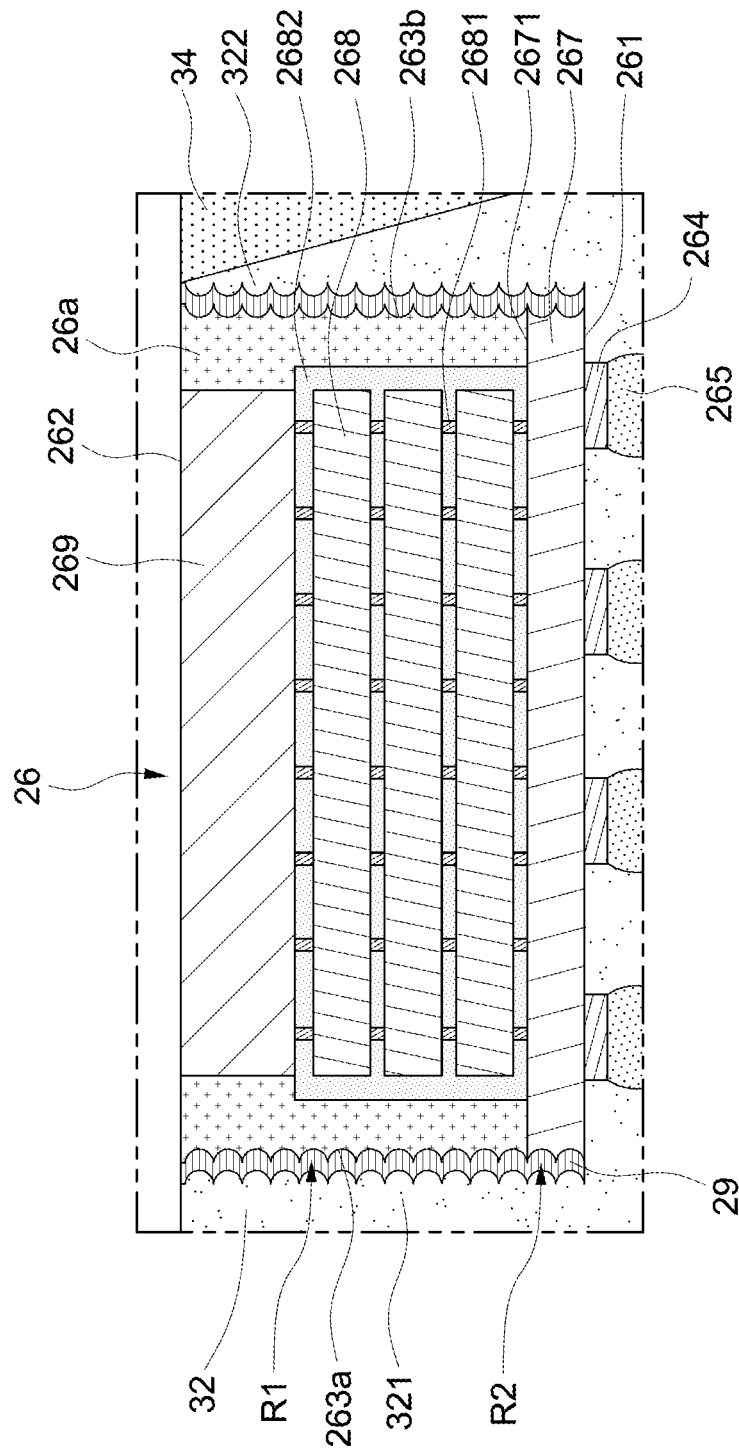
FIG. 16 illustrates an enlarged view of a region of a package structure according to some embodiments of the present disclosure.

FIG. 16 illustrates an enlarged view of a region of a package structure according to some embodiments of the present disclosure. The region of FIG. 16 is similar to the region "A" of FIG. 4, except that a protection layer 29 is disposed between the electronic component 26 and the protection material 32. The protection layer 29 may encapsulate the recesses R1 and R2 in a conformal shape. The protection layer 29 may include, for example, dielectric material or molding compound.

Figure 17:
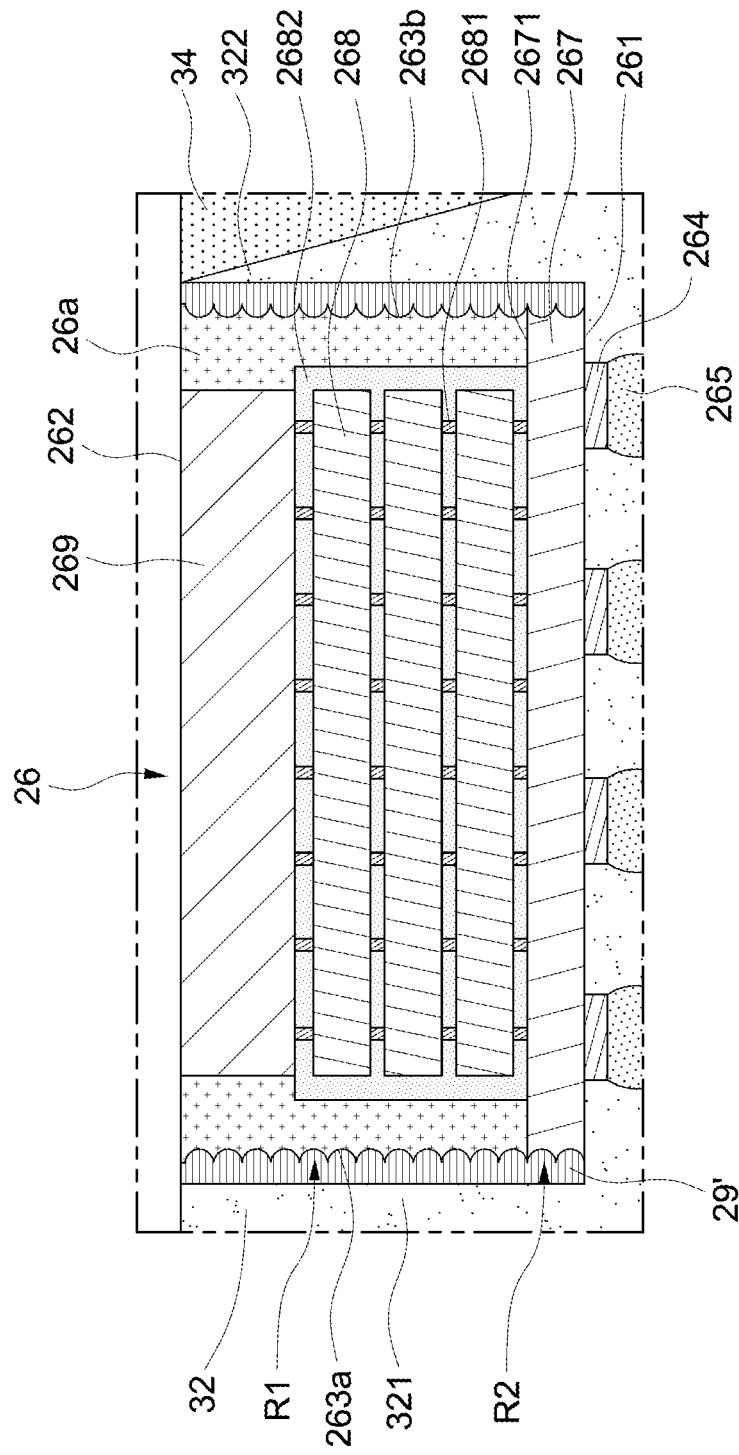
FIG. 17 illustrates an enlarged view of a region of a package structure according to some embodiments of the present disclosure.

FIG. 17 illustrates an enlarged view of a region of a package structure according to some embodiments of the present disclosure. The region of FIG. 17 is similar to the region "A" of FIG. 4, except that a protection layer 29' is disposed between the electronic component 26 and the protection material 32. The protection layer 29' may encapsulate the recesses R1 and R2 and may have an even lateral side surface facing away from the recesses R1 and R2. The protection layer 29' may include, for example, dielectric material or molding compound.

Figure 18:
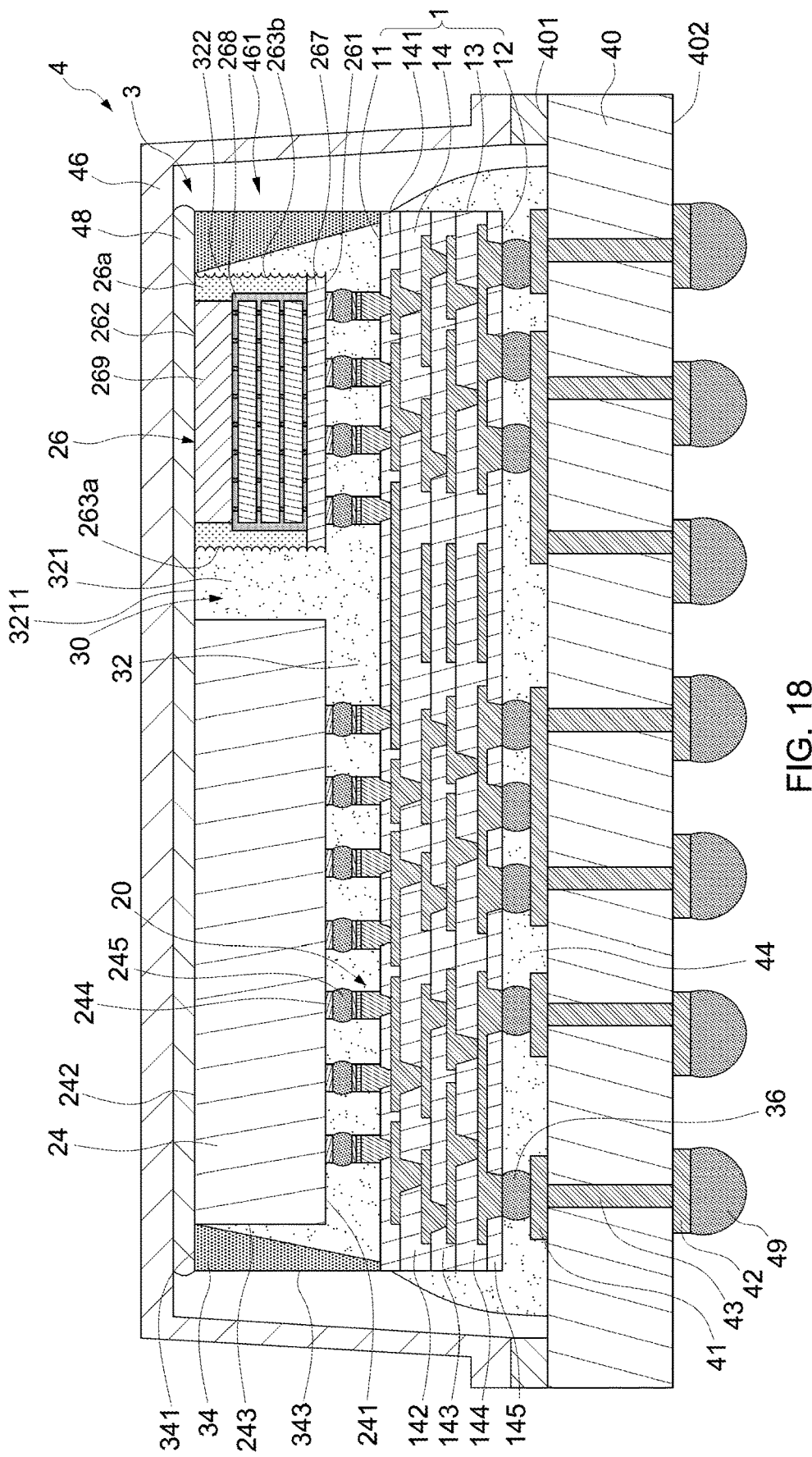
FIG. 18 illustrates a cross-sectional view of an assembly structure according to some embodiments of the present disclosure.

FIG. 18 illustrates a cross-sectional view of an assembly structure 4 according to some embodiments of the present disclosure. The assembly structure 4 may be a semiconductor package structure, and may include a base substrate 40, a package structure 3, a heat sink 46 and a plurality of external connectors 49. The base substrate 40 may include a glass reinforced epoxy material (such as FR4), bismaleimide triazine (BT), epoxy resin, silicon, printed circuit board (PCB) material, glass, ceramic or photoimageable dielectric (PID) material. The base substrate 40 may have a first surface 401 and a second surface 402 opposite to the first surface 401. As shown in FIG. 14, the base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

The package structure 3 of FIG. 18 may be same as or similar to the package structure 3 of FIG. 1 to FIG. 3. The package structure 3 may be electrically connected to the first circuit layer 41 of the base substrate 40 through the solder materials 36. A protection material 44 (i.e., an underfill) may be further included in a space between the package structure 3 and the base substrate 40 so as to cover and protect the solder materials 36 and the first circuit layer 41. Further, the heat sink 46 may be a cap structure or a hat structure, and may define a cavity 461 for accommodating the package structure 3. A material of the heat sink 46 may include metal such as copper, aluminum, and/or other suitable material. A portion of the heat sink 46 may be attached to the top surface of the package structure 3 through a thermal material 48 (e.g., thermal interface material (TIM)) so as to dissipate the heat generated by the first electronic device 24 and the second electronic device 26. Another portion (e.g., bottom portion) of the heat sink 46 may be attached to the first surface 401 of the base substrate 40 through an adhesive material. In addition, the external connectors 49 (e.g., solder balls) are formed or disposed on the second circuit layer 42 for external connection.

FIG. 19 through FIG. 31 illustrate a method for manufacturing an assembly structure according to some embodiments of the present disclosure. In some embodiments, the method is for manufacturing the package structure 3 shown in FIG. 1 to FIG. 3, and the assembly structure 4 of FIG. 18.

Figure 19:
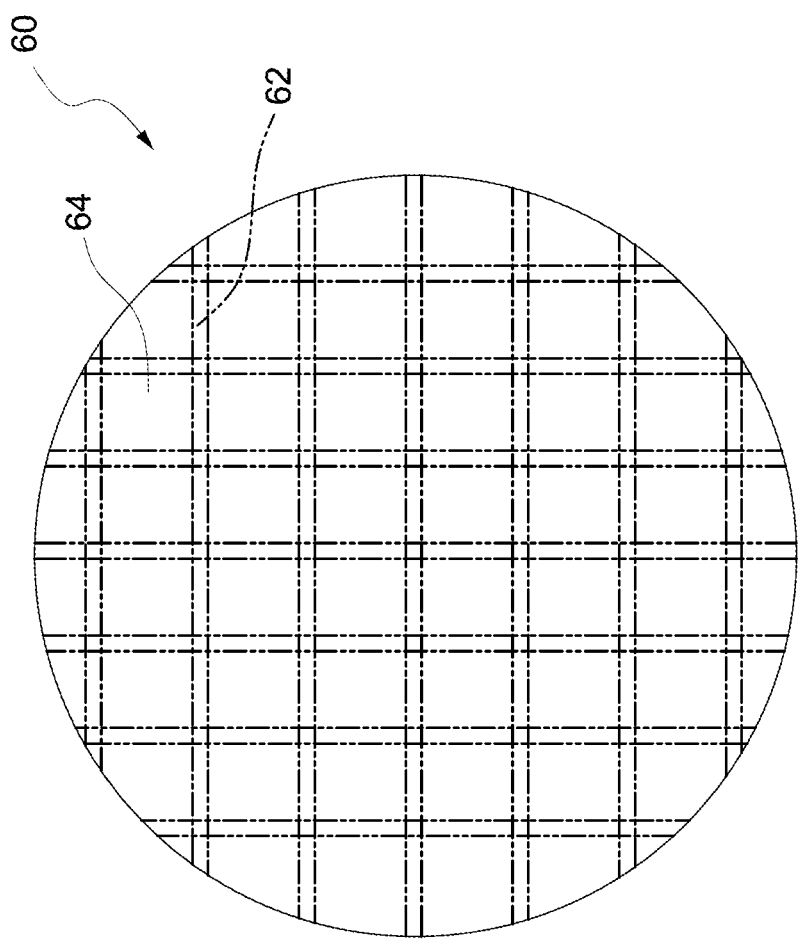
FIG. 19 illustrates one or more stages of an example of a method for manufacturing an assembly structure according to some embodiments of the present disclosure.
Figure 20:
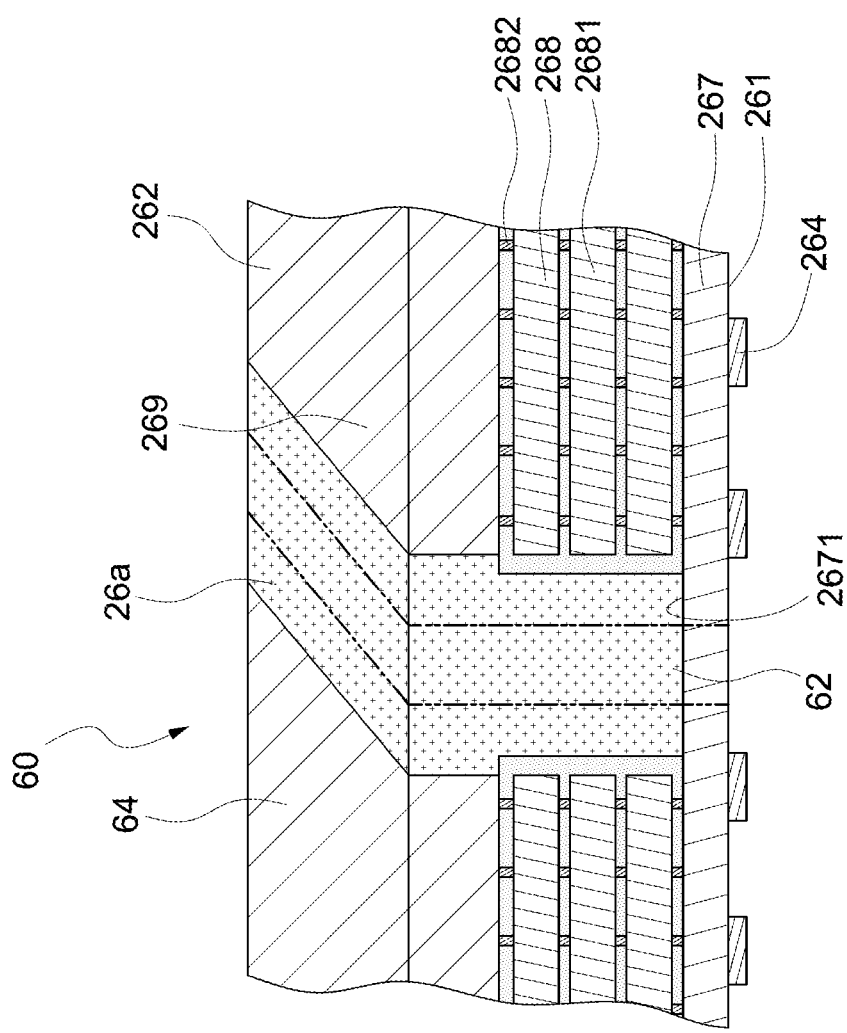
FIG. 20 illustrates one or more stages of an example of a method for manufacturing an assembly structure according to some embodiments of the present disclosure.

Referring to FIG. 19 and FIG. 20, a wafer 60 is provided. FIG. 19 illustrates a top view of the wafer 60 according to some embodiments of the present disclosure, and FIG. 20 illustrates a partially enlarged schematic perspective view of the wafer 60 of FIG. 19. The wafer 60 may be circular, rectangular, square or elliptical. As shown in FIG. 19, the wafer 60 has a plurality of scribe lines 62 crossing each other to define a plurality of electronic device units 64. As shown in FIG. 20, the electronic device unit 64 may be similar to the second electronic device 26 of FIG. 4.

Figure 21:
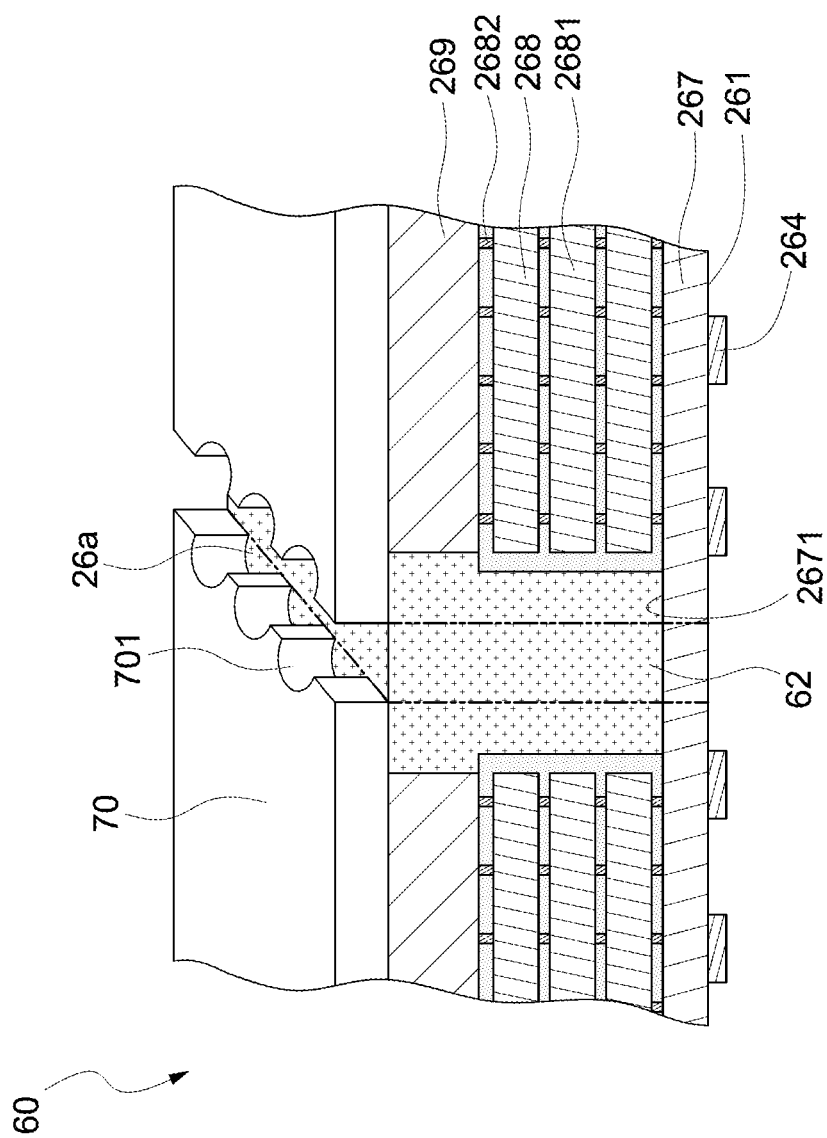
FIG. 21 illustrates one or more stages of an example of a method for manufacturing an assembly structure according to some embodiments of the present disclosure.

Referring to FIG. 21, a photoresist layer 70 is formed on the wafer 60 and is then patterned to expose the plurality of scribe lines 62. The patterned photoresist layer 70 has a boundary with a plurality of curved shapes 701 at the edge thereof. In alternative embodiments, the patterned photoresist layer 70 may have a boundary with a plurality of triangular shapes, rectangular shapes, or trapezoidal shapes from top view.

Figure 22:
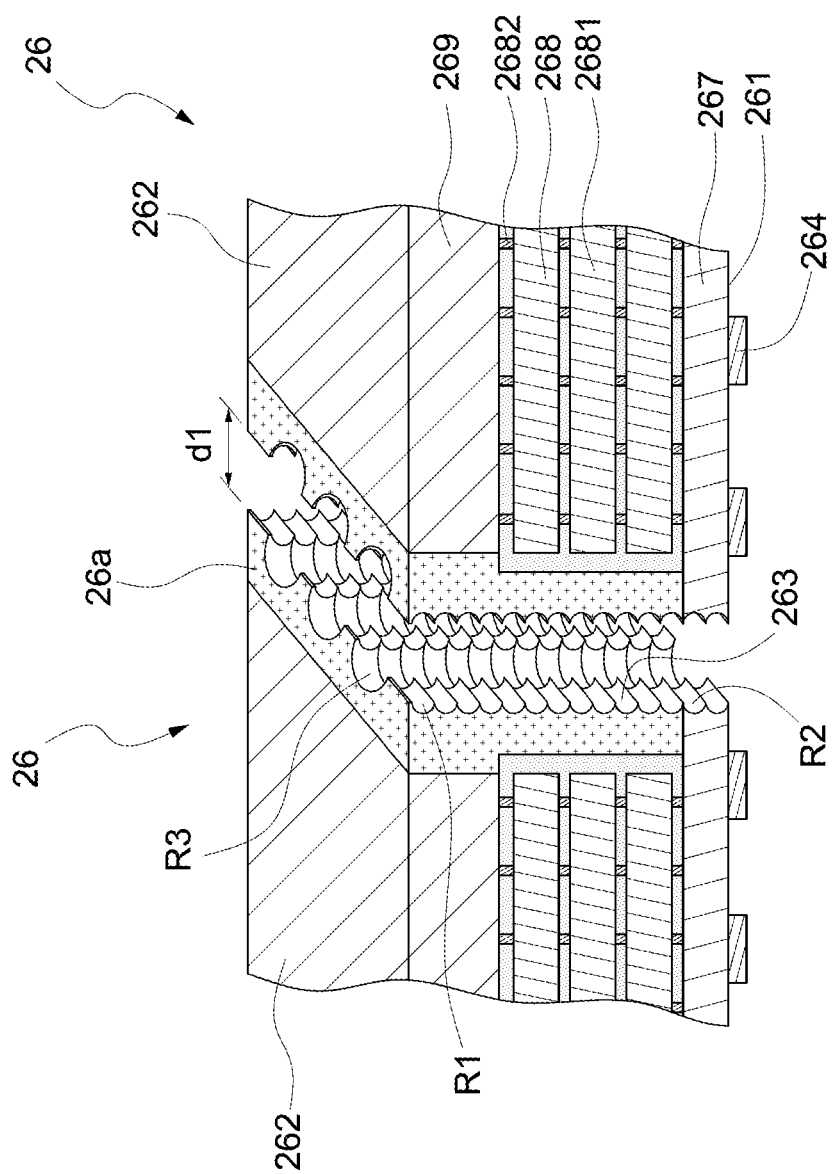
FIG. 22 illustrates one or more stages of an example of a method for manufacturing an assembly structure according to some embodiments of the present disclosure.

Referring to FIG. 22, the wafer 60 may be cut by a plasma etching process along the scribe lines 62 followed by a photoresist removal process. Meanwhile, the electronic device units 64 become a plurality of second electronic devices 26 shown in FIG. 2, FIG. 3, and FIG. 4. Each of the second electronic devices 26 defines plurality of recesses (e.g., a plurality of first recesses R1, a plurality of second recesses R2, and a plurality of third recesses R3) on a lateral side surface 263 thereof by the plasma etching process. The plasma etching process may include steps of breaking through the plurality of scribe lines 62 to form a plurality of trenches, forming a protection layer on the lateral side surfaces of the plurality of trenches, and etching the bottoms of the plurality of trenches. The above steps may be repeated to form the plurality of first recesses R1 and the plurality of second recesses R2. The plurality of first recesses R1 and the plurality of second recesses R2 may be continuously distributed along the lateral surface. The size and the number of the plurality of first recesses R1 and the plurality of second recesses R2 may be varied with the setting of the process parameters of the plasma etching process, for example, the cycle time of the above repetitive steps, power, species, the thickness of the protection layer, etc. In some embodiments, a size of the plurality of first recesses R1 may be the same as or different from that of the plurality of second recesses R2.

In some comparative embodiments, a wafer may be cut by mechanical sawing process along a plurality of scribe lines to form a plurality of electronic devices. However, the mechanical sawing process is low cost but the apparatus thereof has a relatively low through-put. In the present disclosure, the wafer is cut by a plasma etching process along the scribe lines 62 with the patterned photoresist layer 70. The apparatus used in the plasma etching process has significantly higher through-put than that of the mechanical sawing process.

As shown in FIG. 22, adjacent two of the second electronic devices 26 are spaced with a first distance d1. The first distance d1 is in a range from about 10 µm to about 200 µm.

Figure 23:
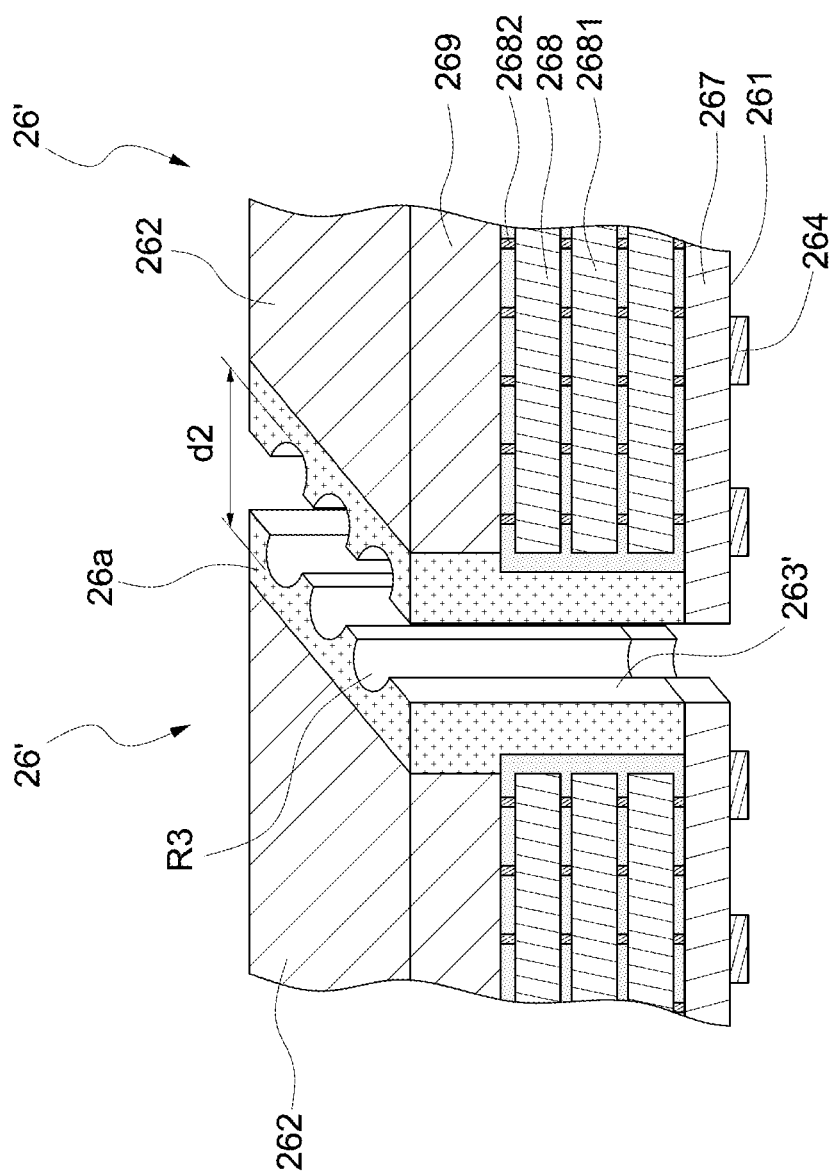
FIG. 23 illustrates one or more stages of an example of a method for manufacturing an assembly structure according to some embodiments of the present disclosure.

Referring to FIG. 23, the wafer 60 may be alternatively cut by a laser drilling process along the scribe lines 62 followed by a photoresist removal process. Meanwhile, the electronic device units 64 become a plurality of second electronic devices 26'. Each of the second electronic devices 26' define a plurality of third recesses R3 on a lateral side surface 263' thereof by the laser drilling process. Adjacent two of the second electronic devices 26' are spaced with a second distance d2. The second distance d2 is in a range from about 10 µm to about 100 µm.

Figure 24:
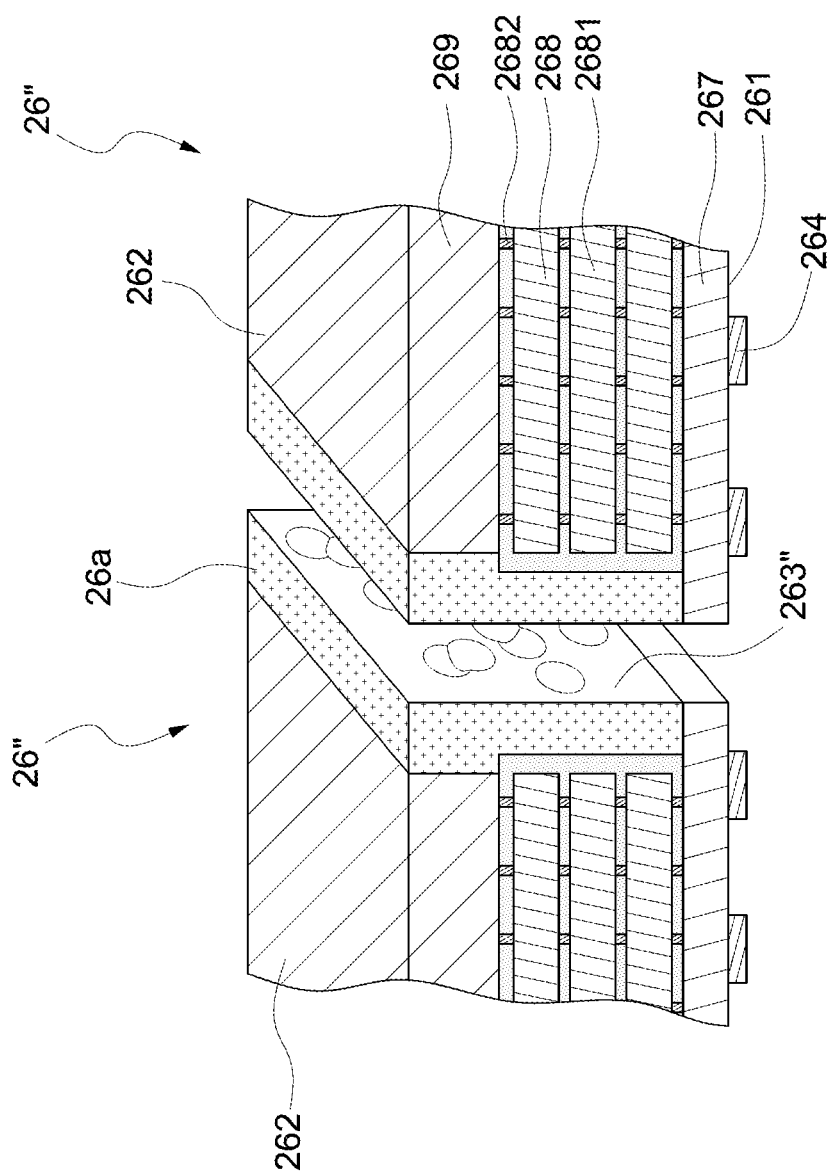
FIG. 24 illustrates one or more stages of an example of a method for manufacturing an assembly structure according to some embodiments of the present disclosure.

Referring to FIG. 24, the wafer 60 may be alternatively cut by a mechanical sawing process along the scribe lines 62 without forming a photoresist layer, and the exposed lateral side surface in the scribe lines 62 may be blasted with sand, or other suitable material. Meanwhile, the electronic device units 64 become a plurality of second electronic devices 26". Each of the second electronic devices 26" defines a plurality of recesses (e.g., a plurality of seventh recesses R7) on a lateral side surface 263" thereof by the blast process. The plurality of recesses are randomly distributed along the lateral side surface 263".

Figure 25:
FIG. 25 illustrates one or more stages of an example of a method for manufacturing an assembly structure according to some embodiments of the present disclosure.

Referring to FIG. 25, a carrier 75 is provided. The carrier 75 may include a release layer 76 disposed thereon.

Figure 26:
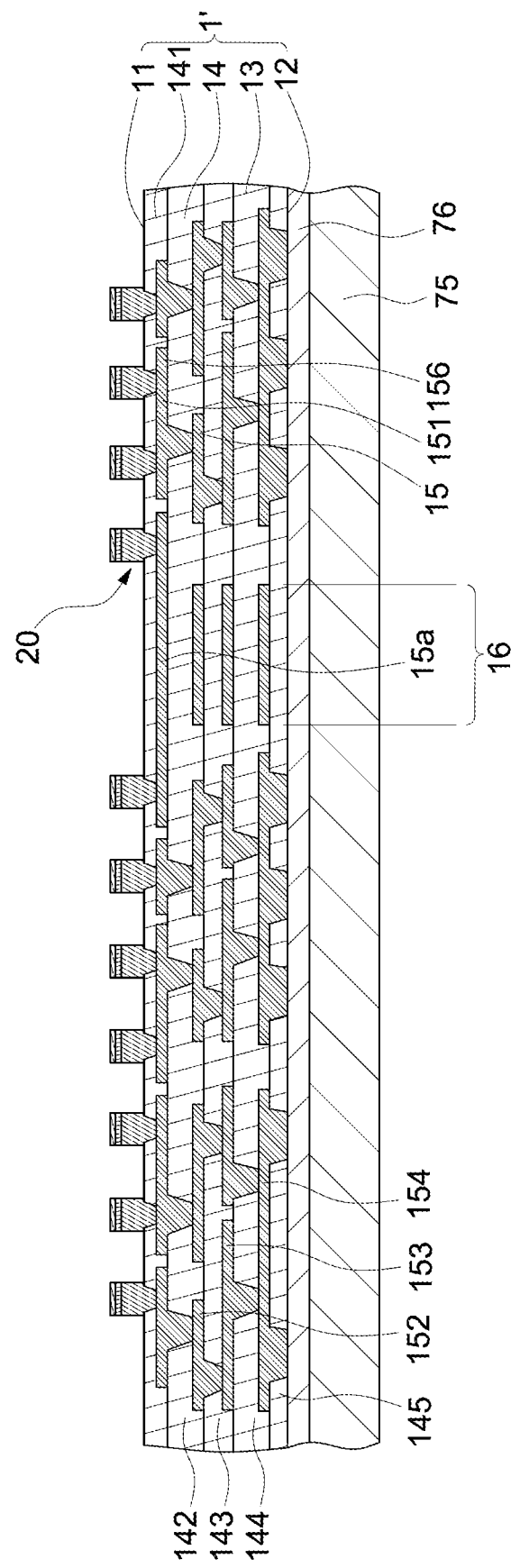
FIG. 26 illustrates one or more stages of an example of a method for manufacturing an assembly structure according to some embodiments of the present disclosure.

Referring to FIG. 26, a wiring structure 1' is formed or disposed on the release layer 76 on the carrier 75. The wiring structure 1' of FIG. 26 may be similar to the wiring structure 1 of FIG. 2 and FIG. 3, and may have a first surface 11, a second surface 12 opposite to the first surface 11, and a high density region 16 (or a fine line region). The wiring structure 1' may include at least one dielectric layer 14, at least one circuit layer 15 in contact with the dielectric layer 14 and a plurality of protrusion pads 20. For example, the wiring structure 1' includes a first dielectric layer 141, a first circuit layer 151, a second dielectric layer 142, a second circuit layer 152, a third dielectric layer 143, a third circuit layer 153, a fourth dielectric layer 144, a fourth circuit layer 154, and a fifth dielectric layer 145.

Figure 27:
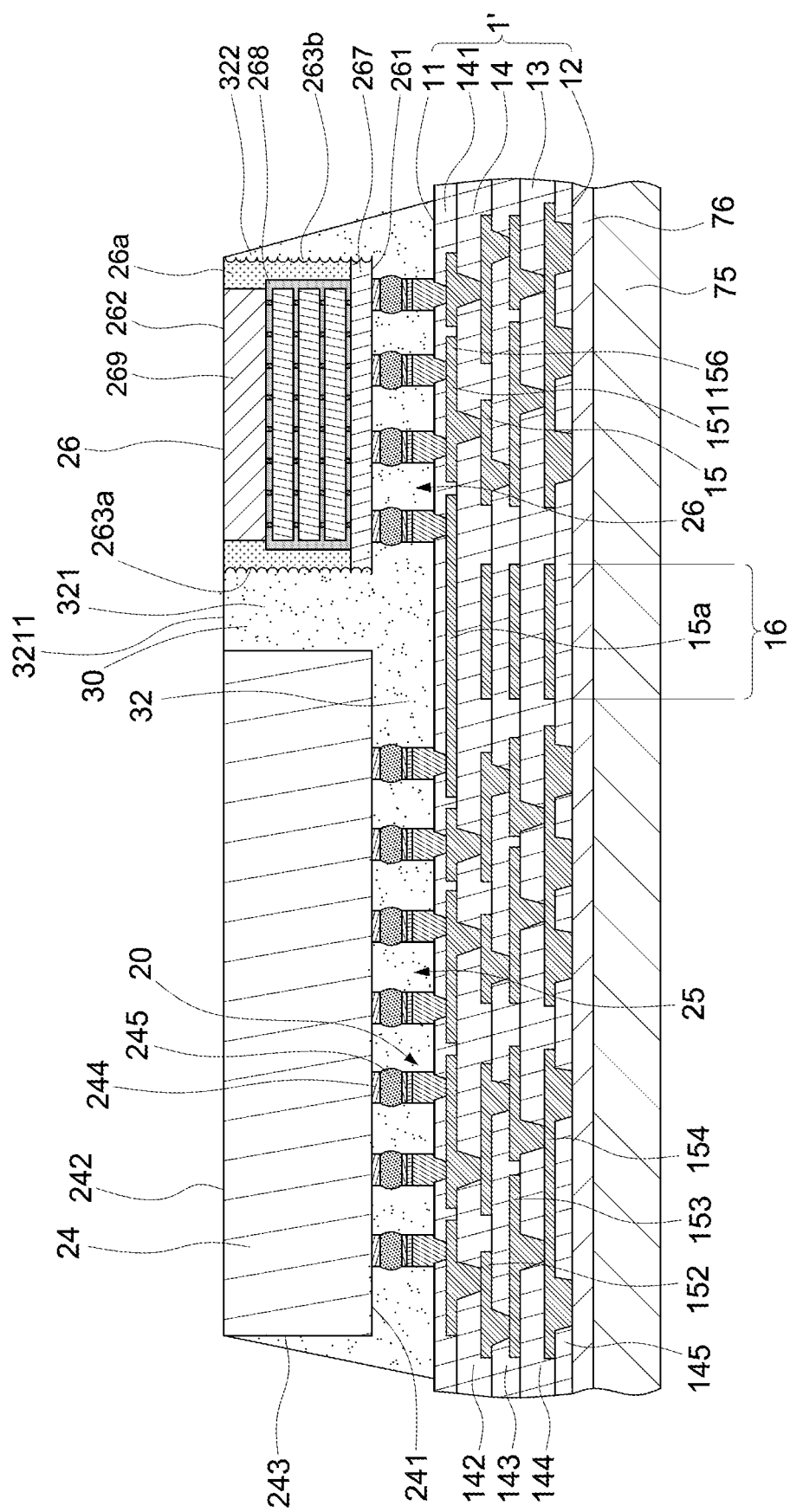
FIG. 27 illustrates one or more stages of an example of a method for manufacturing an assembly structure according to some embodiments of the present disclosure.

Referring to FIG. 27, a first electronic device 24 and a second electronic device 26 are bonded to and electrically connected to the protrusion pads 20. Thus, the first electronic device 24 and the second electronic device 26 are disposed side by side, and are electrically connected to the circuit layer 15 of the wiring structure 1'. The first electronic device 24 and the second electronic device 26 of FIG. 27 may be similar to the first electronic device 24 and the second electronic device 26 of FIG. 2 and FIG. 3, respectively, Then, a protection material 32 (i.e., an underfill) may be formed or disposed in a space between the first electronic device 24 and the wiring structure 1' so as to cover and protect the joints formed by the first electrical contacts 244, the protrusion pads 20 and the solder materials 245. Further, the protection material 32 may be disposed in a space between the second electronic device 26 and the wiring structure 1' so as to cover and protect the joints formed by the second electrical contacts 264, the protrusion pads 20 and the solder materials 265.

In addition, the protection material 32 may include a first portion 321, and a second portion 322. The first portion 321 of the protection material 32 may further extend into a gap 30 between the first electronic device 24 and the second electronic device 26. The first portion 321 of the protection material 32 may be disposed on the first lateral side surface 263a of the second electronic device 26. The second portion 322 of the protection material 32 may extend to or may be disposed on the second lateral side surface 263b of the second electronic device 26. The recesses (the plurality of first recesses R1, the plurality of second recesses R2, and the plurality of third recesses R3) of the second electronic device 26 are encapsulated by the protection material 32. As such, the contact area between the second electronic device 26 and the protection material 32 may be increased. The larger contact area improves the adhesion and bonding strength therebetween. In other words, the recesses (e.g., the plurality of first recesses R1, the plurality of second recesses R2, and the plurality of third recesses R3) function as mold locks to fasten or grip the protection material 32. Hence, the mold-lock-like recesses on the lateral side surface 263a of the second electronic device 26 prevent delamination or cracks in the heterojunctions of the second electronic device 26 and the protection material 32 induced by warpage which occurs during the thermal process.

Figure 28:
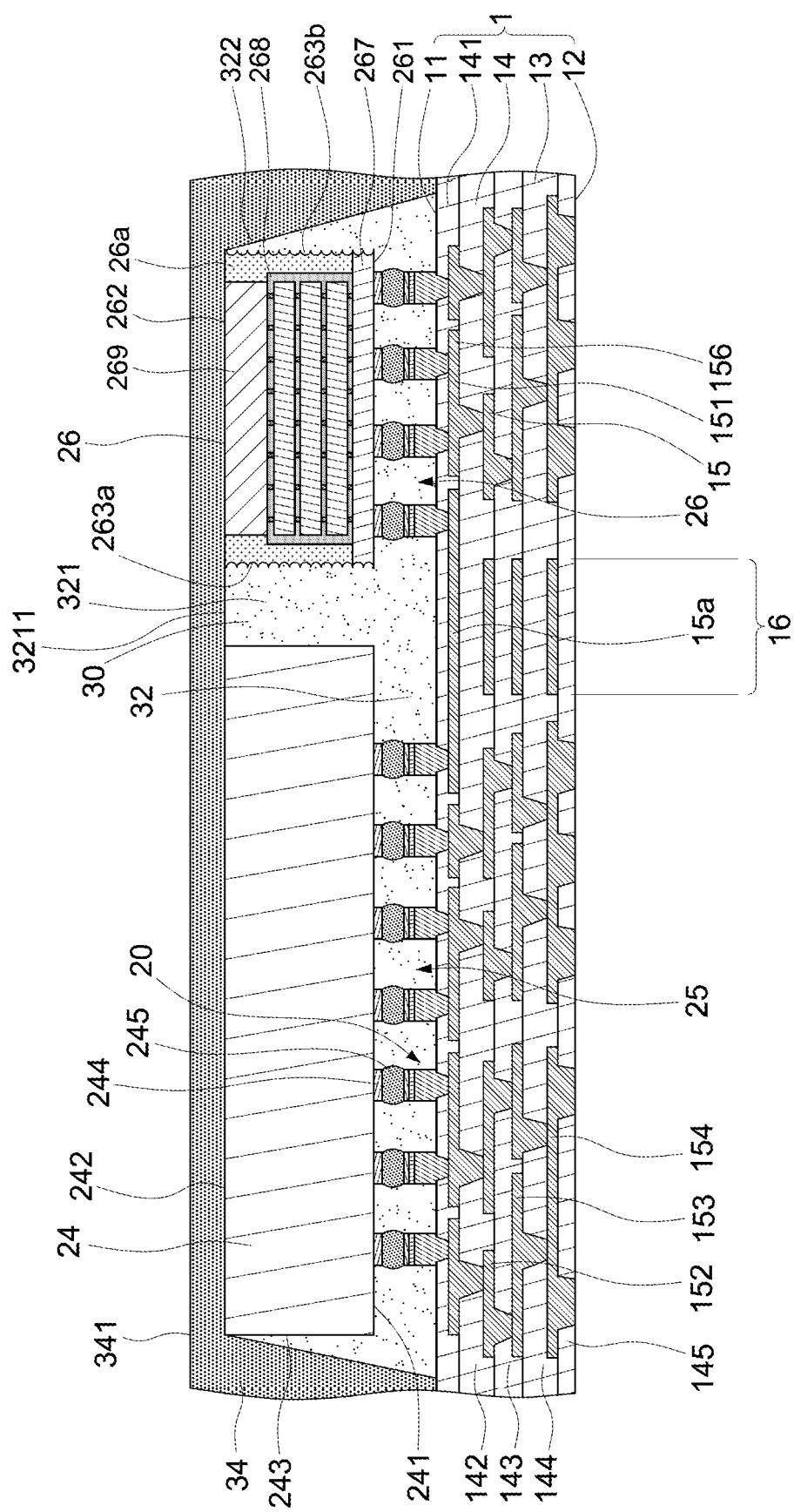
FIG. 28 illustrates one or more stages of an example of a method for manufacturing an assembly structure according to some embodiments of the present disclosure.

Referring to FIG. 28, an encapsulant 34 is formed or disposed to cover at least a portion of at least a portion of the first electronic device 24, at least a portion of the second electronic device 26 and the protection material 32. The encapsulant 34 has a first surface 341 (e.g., a top surface). Then, the carrier 75 and the release layer 76 are removed. Thus, portions (i.e., the bottom portions of the via portions) of the fourth circuit layer 154 are exposed from the second surface 12 of the wiring structure 1'.

Figure 29:
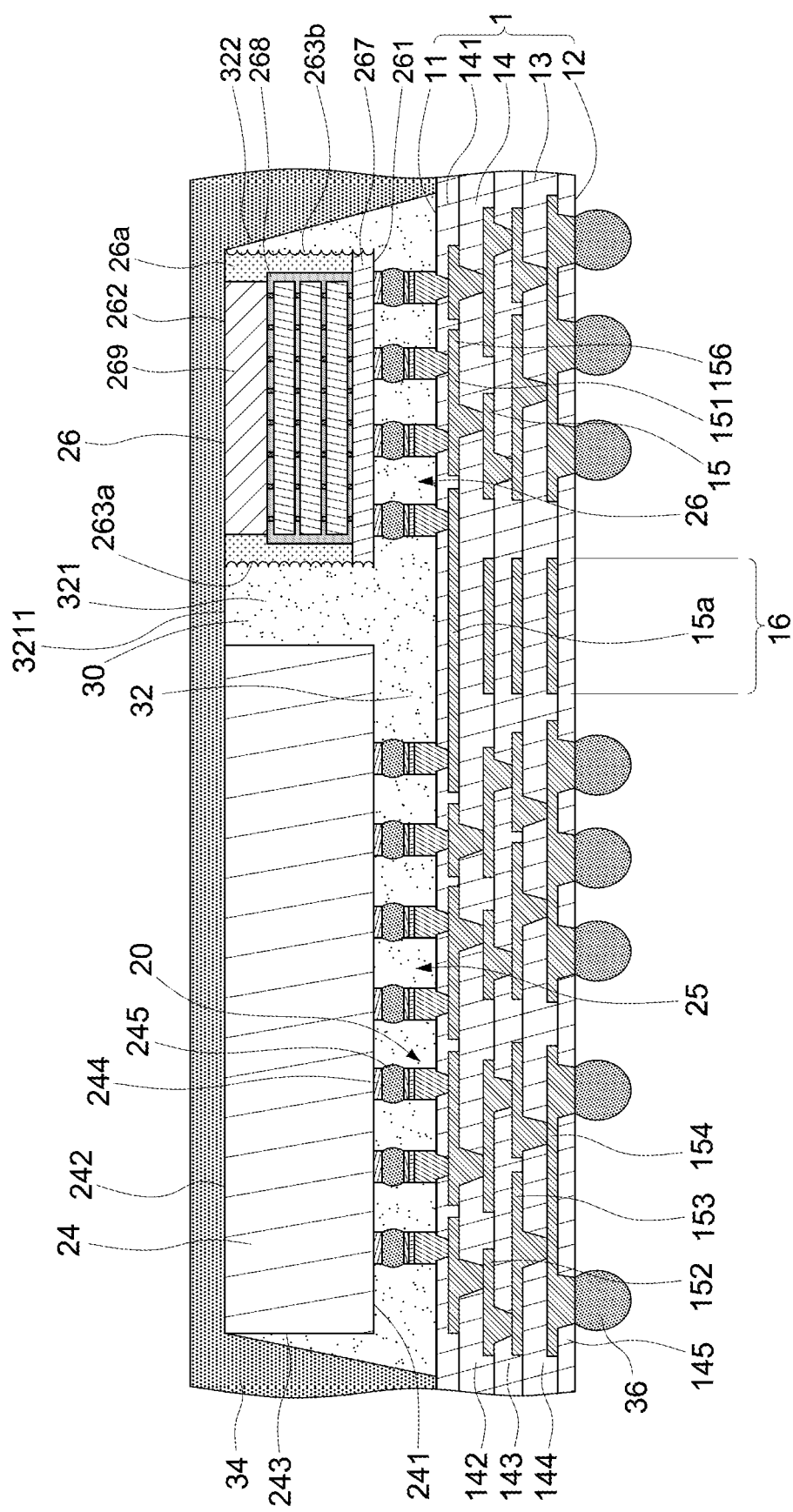
FIG. 29 illustrates one or more stages of an example of a method for manufacturing an assembly structure according to some embodiments of the present disclosure.

Referring to FIG. 29, a plurality of solder materials 36 (e.g., solder balls) are formed or disposed to the second surface 12 of the wiring structure 1'. As shown in FIG. 29, the solder materials 36 are disposed on the exposed portions (i.e., the bottom portions of the via portions) of the fourth circuit layer 154.

Figure 30:
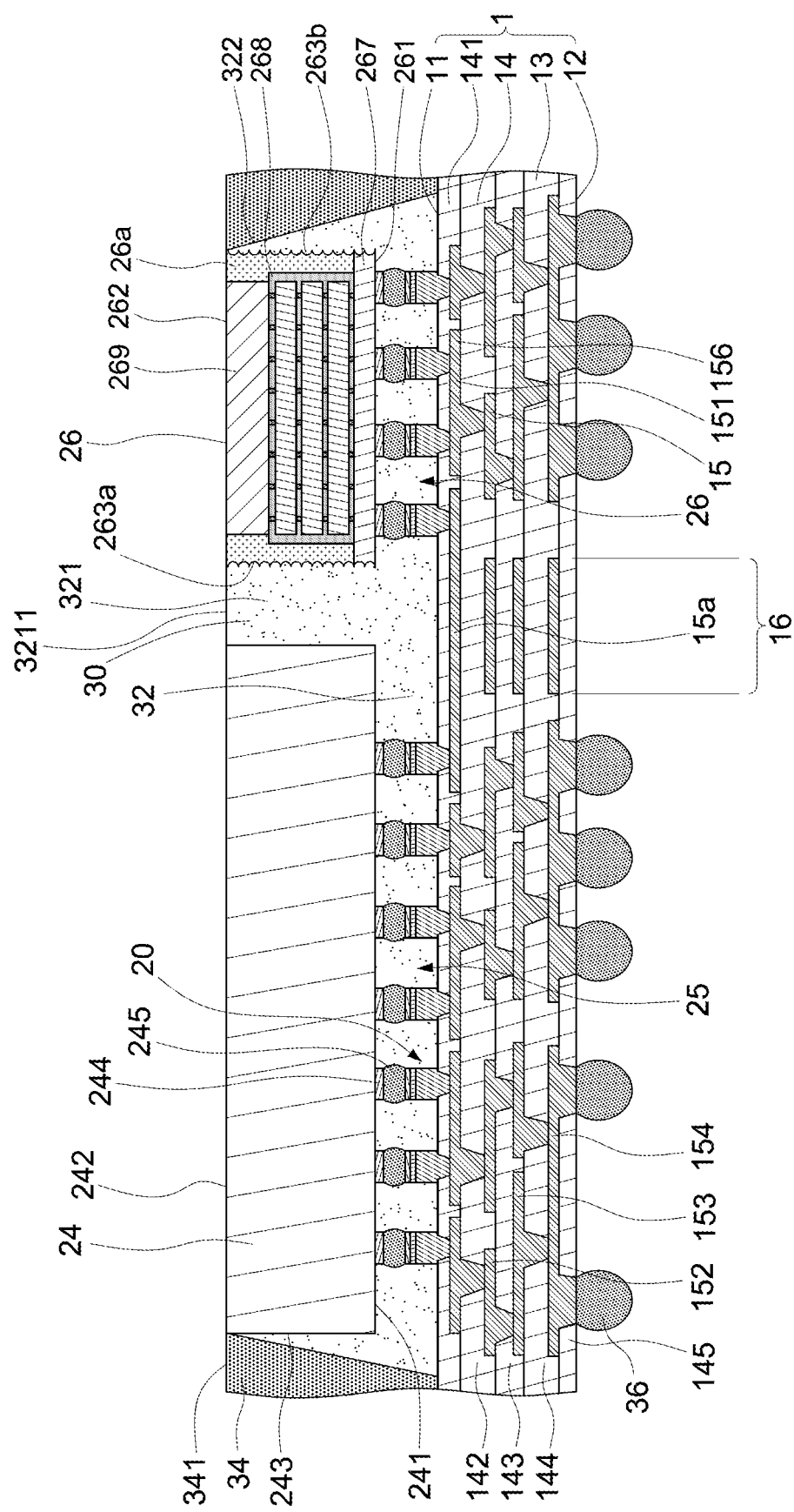
FIG. 30 illustrates one or more stages of an example of a method for manufacturing an assembly structure according to some embodiments of the present disclosure.

Referring to FIG. 30, the encapsulant 34 is thinned from its first surface 341. Thus, the first surface 341 of the encapsulant 34, the first backside surface 242 of the first electronic device 24, the second backside surface 262 of the second electronic device 26 and a top surface 3211 of the protection material 32 in the gap 30 may be substantially coplanar with each other.

In some embodiments, a singulation process may be conducted to cut the encapsulant 34 and the wiring structure 1' so as to obtain a plurality of package structures 3 shown in FIG. 1 to FIG. 3.

Figure 31:
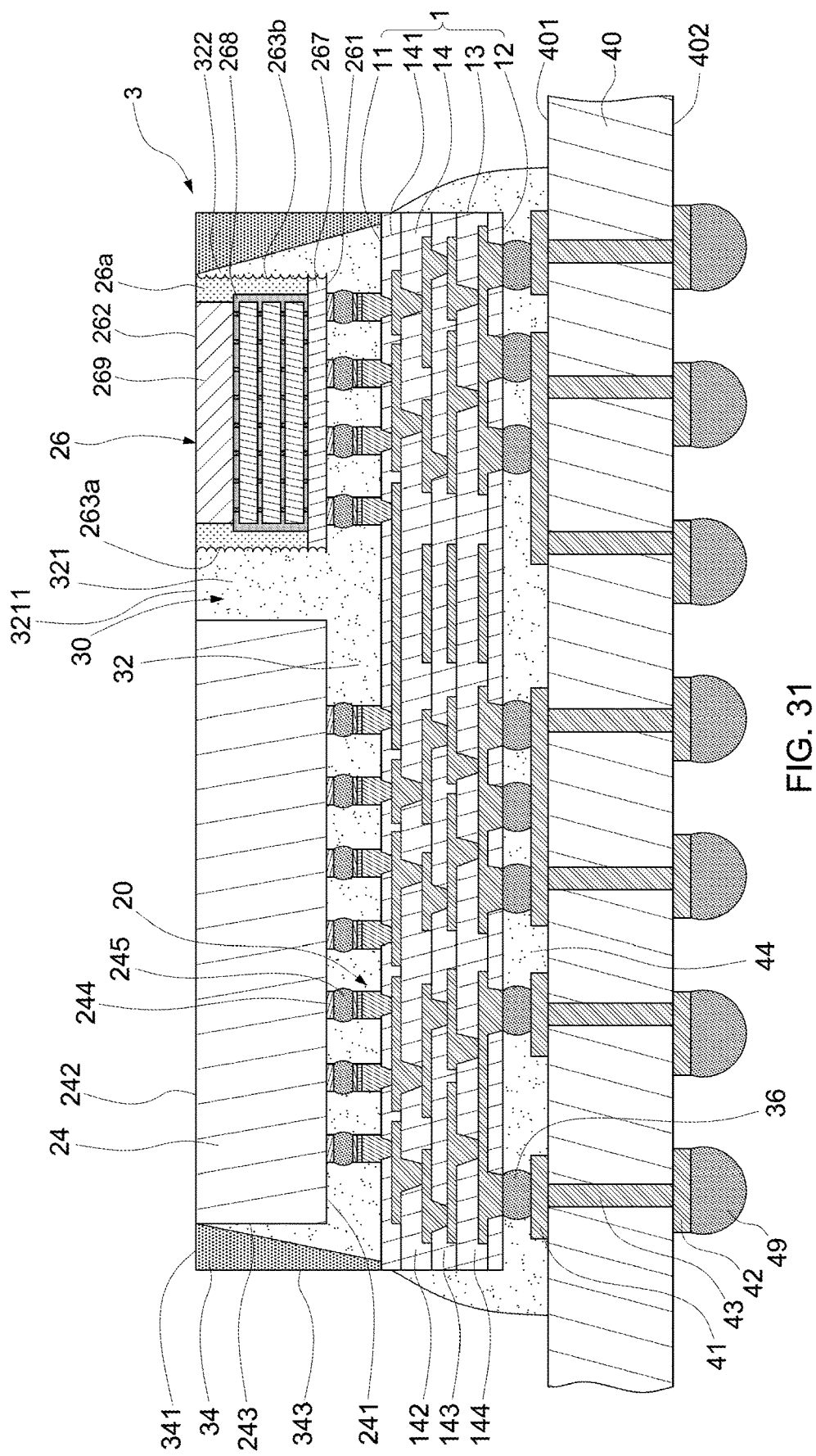
FIG. 31 illustrates one or more stages of an example of a method for manufacturing an assembly structure according to some embodiments of the present disclosure.

Referring to FIG. 31, the package structure 3 may be electrically connected to a first circuit layer 41 of a base substrate 40 through the solder materials 36. The base substrate 40 may have a first surface 401 and a second surface 402 opposite to the first surface 401. The base substrate 40 may include a first circuit layer 41, a second circuit layer 42, and a plurality of conductive vias 43. The first circuit layer 41 may be disposed adjacent to the first surface 401 of the base substrate 40, and the second circuit layer 42 may be disposed adjacent to the second surface 402 of the base substrate 40. The conductive vias 43 may extend through the base substrate 40 and electrically connect the first circuit layer 41 and the second circuit layer 42.

Then, a protection material 44 (i.e., an underfill) may be formed or disposed in a space between the package structure 3 and the base substrate 40 so as to cover and protect the solder materials 36 and the first circuit layer 41.

Then, a heat sink 46 may be attached to the first electronic device 24, the second electronic device 26 and the base substrate 40. In some embodiments, the heat sink 46 may be a cap structure or a hat structure, and may define a cavity 461 for accommodating the package structure 3. A portion of the heat sink 46 may be attached to the top surface of the package structure 3 through a thermal material 48 (e.g., thermal interface material (TIM)). Another portion (e.g., bottom portion) of the heat sink 46 may be attached to the base substrate 40 through an adhesive material. Then, a plurality of external connectors 49 (e.g., solder balls) may be formed or disposed on the second circuit layer 42 for external connection.

Then, a singulation process may be conducted to cut the base substrate 40 so as to obtain a plurality of assembly structures 4 shown in FIG. 18.

FIG. 32 through FIG. 39 illustrate a method for manufacturing an electronic device according to some embodiments of the present disclosure. In some embodiments, the method is for manufacturing the second electronic device 96 shown in FIG. 9 and/or the second electronic device 106 shown in FIG. 10.

Figure 32:
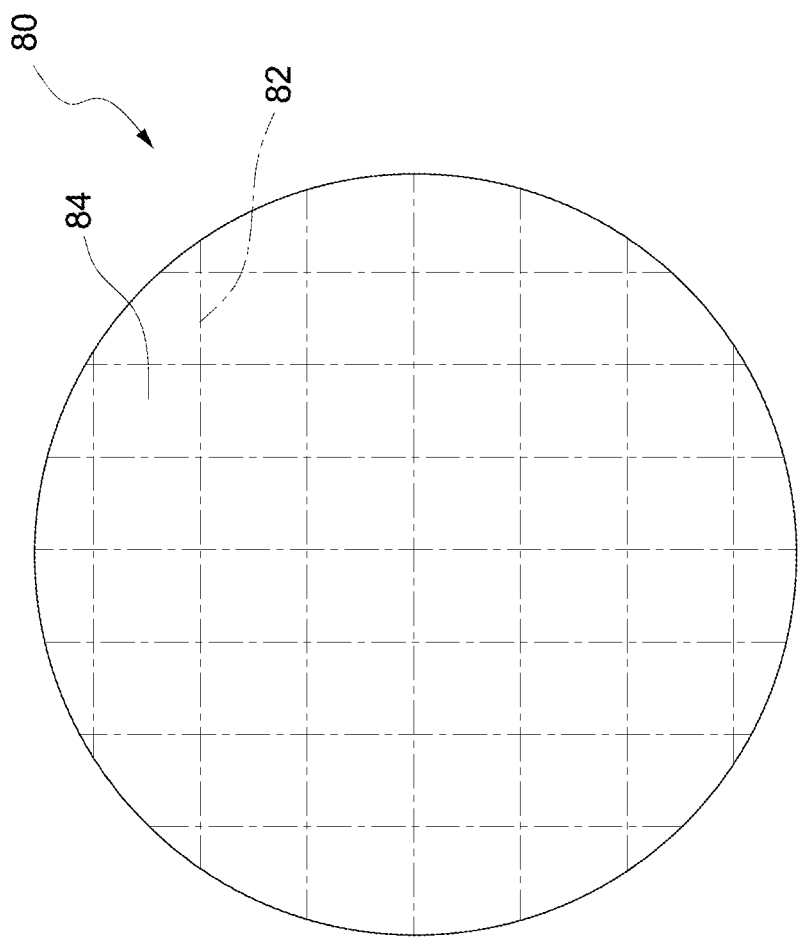
FIG. 32 illustrates one or more stages of an example of a method for manufacturing an electronic device according to some embodiments of the present disclosure.

Referring to FIG. 32 and FIG. 33, a wafer 80 is provided. FIG. 32 illustrates a top view of the wafer 80 according to some embodiments of the present disclosure, and FIG. 33 illustrates a partially enlarged schematic perspective view of the wafer 80 of FIG. 32. The wafer 80 may be circular, rectangular, square or elliptical. In some embodiments, the wafer 80 may be a silicon wafer. As shown in FIG. 32, the wafer 80 has a plurality of scribe lines 82 crossing each other to define a plurality of die units 84.

Referring to FIG. 34, a photoresist layer 90 is formed on the wafer 80 and patterned to expose the plurality of scribe lines 82. The patterned photoresist layer 90 has a boundary with a plurality of curved shapes 901 at the edge thereof. In alternative embodiments, the patterned photoresist layer 90 may have a boundary with a plurality of triangular shapes, rectangular shapes, or trapezoidal shapes from the top view.

Figure 35:
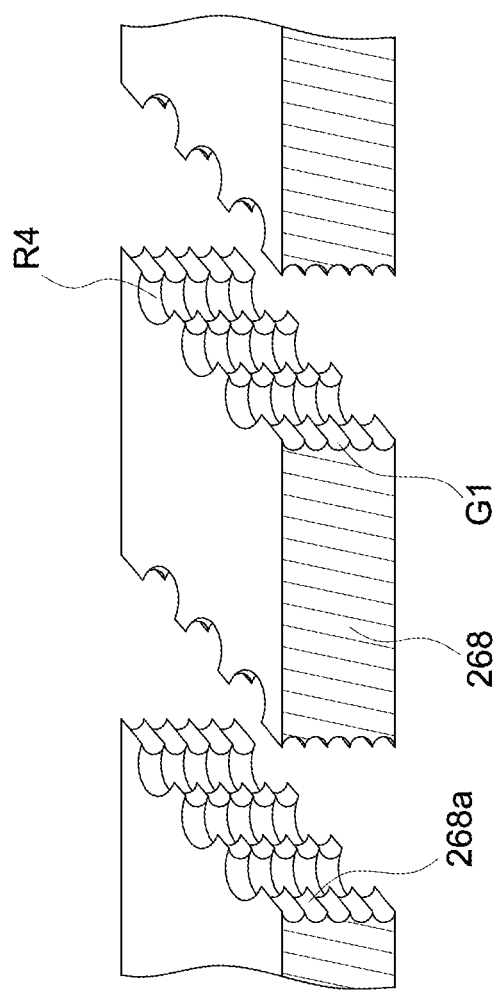
FIG. 35 illustrates one or more stages of an example of a method for manufacturing an electronic device according to some embodiments of the present disclosure.

Referring to FIG. 35, the wafer 80 may be cut by a plasma etching process along the scribe lines 82 followed by a photoresist removal process. Meanwhile, the die units 84 become a plurality of memory dice 268 shown in FIG. 9 and FIG. 10. Each of the memory dice 268 defines a plurality of first grooves G1 and a plurality of fourth recesses R4 on a lateral side surface 268a thereof by the plasma etching process.

Figure 36:
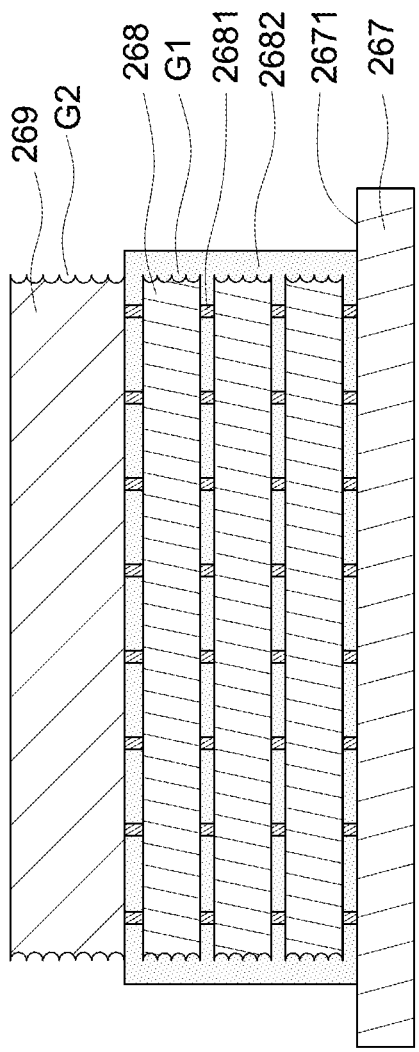
FIG. 36 illustrates one or more stages of an example of a method for manufacturing an electronic device according to some embodiments of the present disclosure.

Referring to FIG. 36, the plurality of memory dice 268 are stacked on a basic die 267, and a block die 269 is stacked on the memory dice 268. The block die 269 may define a plurality of second grooves G2 by a process similar to that as illustrated in FIG. 32 to FIG. 35.

Still referring to FIG. 36, a plurality of connection structures 2681 is formed to electrically connect the memory dice 268 with each other, with the block die 269, or with the basic die 267. An adhesive layer 2682 is formed to cover the memory dice 268. The adhesive layer 2682 includes a plurality of portions disposed between the memory dice 268. The adhesive layer 2682 further includes a portion disposed between the block die 269 and the topmost one of the memory dice 268, and another portion disposed between the basic die 267 and the lowermost one of the memory dice 268.

Figure 37:
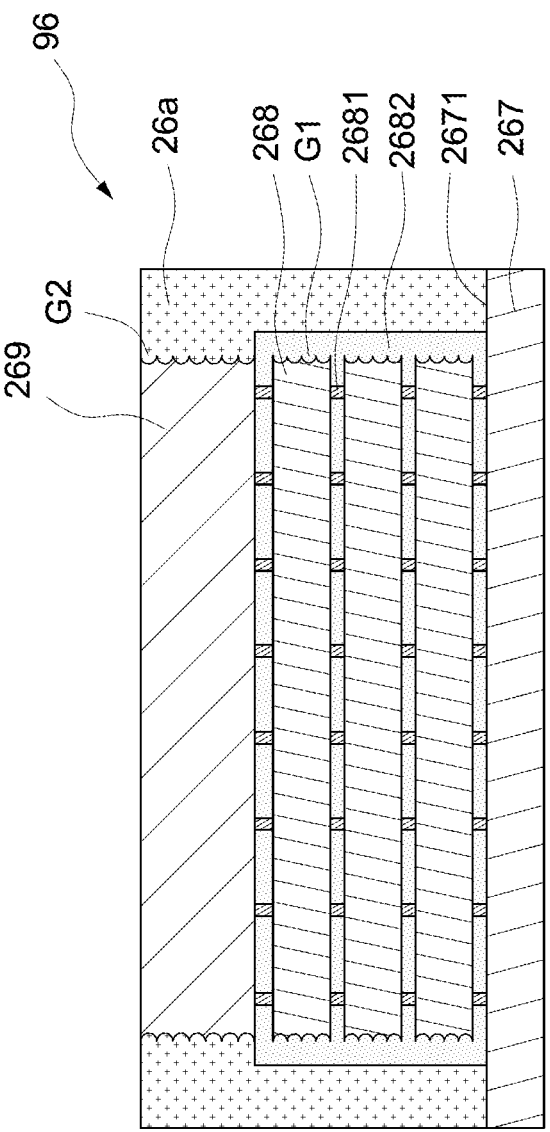
FIG. 37 illustrates one or more stages of an example of a method for manufacturing an electronic device according to some embodiments of the present disclosure.

Referring to FIG. 37, a second encapsulant 26a is formed to cover a portion of a top surface 2671 of the basic die 267, the memory dice 268, and the block die 269, and to obtain the second electronic device 96 shown in FIG. 9. In some embodiments, the second encapsulant 26a may encapsulate the first grooves G1.

Figure 38:
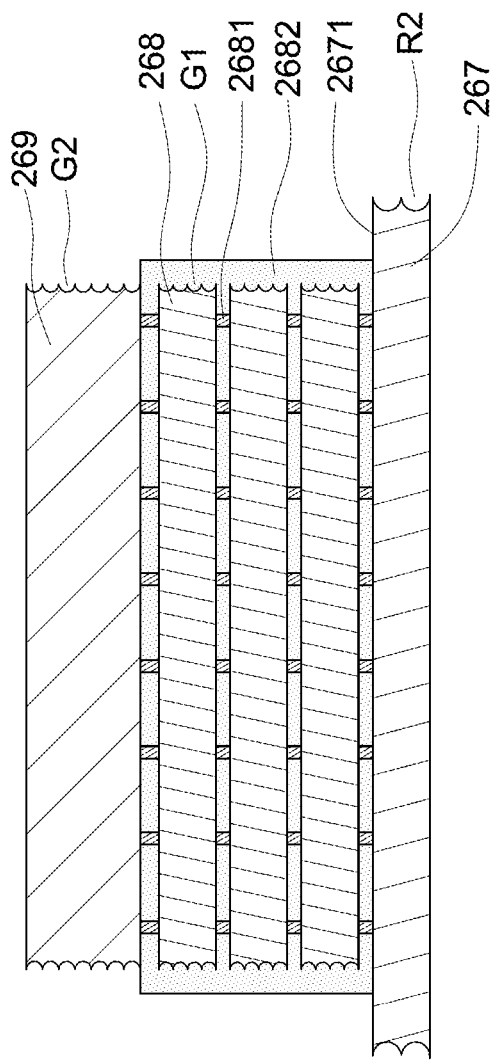
FIG. 38 illustrates one or more stages of an example of a method for manufacturing an electronic device according to some embodiments of the present disclosure.

Referring to FIG. 38, the plurality of memory dice 268 are stacked on a basic die 267, and a block die 269 is stacked on the memory dice 268. The basic die 267 may define a plurality of second recesses R2 by a process similar to that as illustrated in FIG. 32 to FIG. 35. The block die 269 may define a plurality of second grooves G2 by a process similar to that as illustrated in FIG. 32 to FIG. 35.

Figure 39:
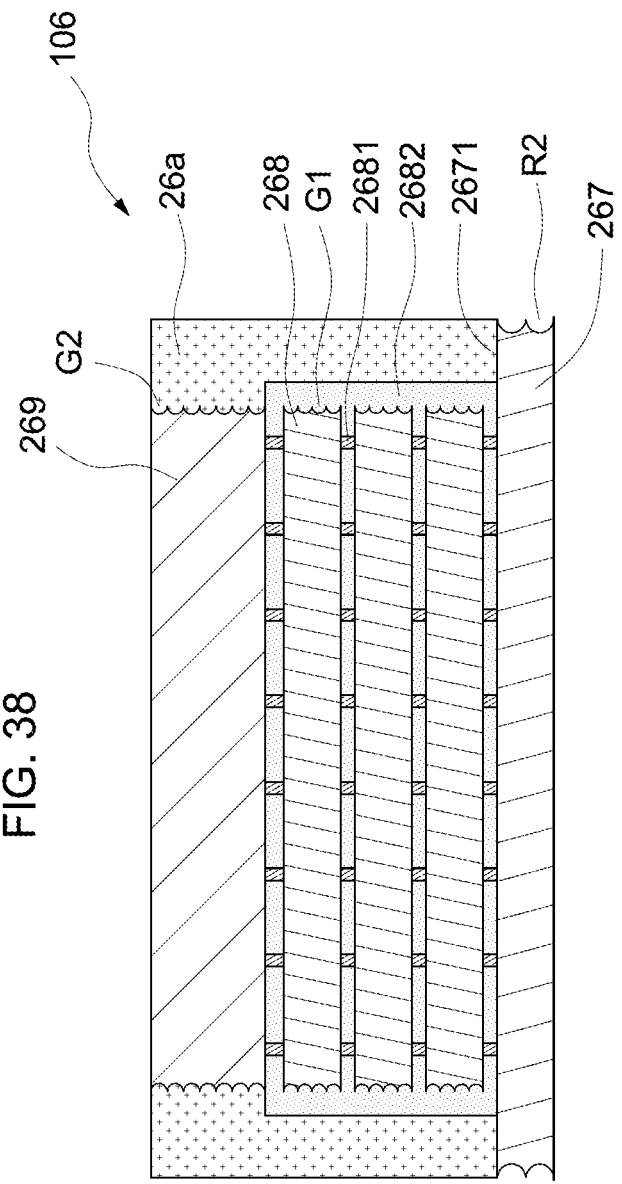
FIG. 39 illustrates one or more stages of an example of a method for manufacturing an electronic device according to some embodiments of the present disclosure.

Referring to FIG. 39, a second encapsulant 26a is formed to cover a portion of a top surface 2671 of the basic die 267, the memory dice 268, and the block die 269, and to obtain the second electronic device 106 shown in FIG. 11.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a wiring structure;
    a first electronic device disposed on the wiring structure;
    a second electronic device disposed on the wiring structure, wherein the second electronic device defines a plurality of recesses on a first lateral side surface thereof; and
    a protection material disposed on the wiring structure and encapsulating the recesses of the second electronic device,
    wherein the protection material is disposed between the first electronic device and the second electronic device, and the first lateral side surface of the second electronic device faces toward the first electronic device.

2. A semiconductor package structure, comprising:
    a wiring structure;
    a first electronic device disposed on the wiring structure;
    a second electronic device disposed on the wiring structure, wherein the second electronic device defines a plurality of recesses on a first lateral side surface thereof; and
    a protection material disposed on the wiring structure and encapsulating the recesses of the second electronic device,
    wherein the second electronic device includes a basic die, a plurality of stacked dice stacked on a top surface of the basic die and an encapsulant encapsulating the stacked dice and the top surface of the basic die, and wherein the recesses include a plurality of first recesses on a lateral side surface of the encapsulant and plurality of second recesses on a lateral side surface of the basic die.

3. The semiconductor package structure of claim 2, wherein each of the stacked dice defines a plurality of grooves on a lateral side surface thereof.

4. A semiconductor package structure, comprising:
a wiring structure;
a first electronic device disposed on the wiring structure;
a second electronic device disposed on the wiring structure, wherein the second electronic device defines a plurality of recesses on a first lateral side surface thereof; and
a protection material disposed on the wiring structure and encapsulating the recesses of the second electronic device,
wherein the recesses are distributed on the first lateral side surface of the second electronic device from a top view, and the recesses face toward the first electronic device.

5. The semiconductor package structure of claim 4, wherein the second electronic device has four lateral side surfaces, and the recesses are distributed on the four lateral side surfaces of the second electronic device from a top view.

6. The semiconductor package structure of claim 2, wherein a width of the basic die is different from a width of the encapsulant.

7. The semiconductor package structure of claim 6, wherein a width of the basic die is greater than a width of the encapsulant.

8. The semiconductor package structure of claim 6, wherein a width of the basic die is smaller than a width of the encapsulant.

9. The semiconductor package structure of claim 4, wherein each of the recesses has a curved shape, a triangle shape, a rectangular shape, or a trapezoidal shape from top view.

10. The semiconductor package structure of claim 4, wherein each of the recesses has a curved shape having a width and a depth, and a ratio of the width to the depth is less than or equal to 50.

11. An electronic device, comprising:
a first die defining a plurality of first recesses on a lateral side surface thereof;
a second die stacked on a top surface of the first die and electrically connected to the first die, wherein a size of the second die is less than a size of the first die;
an encapsulant covering the second die and a portion of the top surface of the first die, wherein the encapsulant defines a plurality of second recesses on a lateral side surface thereof; and
a protection layer encapsulating the second recesses.

12. The electronic device of claim 11, further comprising a plurality of third recesses substantially perpendicular to the first recesses and the second recesses, wherein each of the third recesses has a curved shape, a triangle shape, a rectangular shape, or a trapezoidal shape from a top view.

13. The semiconductor package structure of claim 2, wherein the protection material covers the lateral side surface of the encapsulant and the lateral side surface of the basic die.

14. The semiconductor package structure of claim 3, wherein the plurality of grooves has a concave shape.

15. The semiconductor package structure of claim 4, wherein the recesses are substantially perpendicular to a backside surface of the second electronic device.

16. The semiconductor package structure of claim 4, wherein each of the recesses has a concave shape.

17. The semiconductor package structure of claim 16, wherein the concave shape has a depth and a width, and a ratio of the width to the depth is in a range from about 3 to about 5.

18. The semiconductor package structure of claim 4, wherein the recesses are continuously distributed along the first lateral side surface of the second electronic device.

* * * * *